United States Patent
Kato et al.

(10) Patent No.: US 7,344,925 B2
(45) Date of Patent: Mar. 18, 2008

(54) SEMICONDUCTOR DEVICE, METHOD OF MANUFACTURING THE SAME, AND METHOD OF DESIGNING THE SAME

(75) Inventors: Kiyoshi Kato, Sagamihara (JP); Toshihiko Saito, Atsugi (JP); Atsuo Isobe, Atsugi (JP); Toru Takayama, Atsugi (JP); Junya Maruyama, Ebina (JP); Yuugo Goto, Atsugi (JP); Yumiko Ohno, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 97 days.

(21) Appl. No.: 11/064,820

(22) Filed: Feb. 25, 2005

(65) Prior Publication Data

US 2005/0158936 A1 Jul. 21, 2005

Related U.S. Application Data

(62) Division of application No. 10/395,310, filed on Mar. 25, 2003, now Pat. No. 6,875,998.

(30) Foreign Application Priority Data

Mar. 26, 2002 (JP) ............................. 2002-085807

(51) Int. Cl.
*H01L 21/00* (2006.01)
*H01L 21/84* (2006.01)
*H01L 21/336* (2006.01)
*H01L 21/8234* (2006.01)
*H01L 21/331* (2006.01)

(52) U.S. Cl. ...................... 438/149; 438/197; 438/154; 438/378

(58) Field of Classification Search ................ 438/197, 438/166, 689, 162, 145, 487, 149, 150, 153–154, 438/308, 378
See application file for complete search history.

(56) References Cited

U.S. PATENT DOCUMENTS 5,643,826 A 7/1997 Ohtani et al.

(Continued)

FOREIGN PATENT DOCUMENTS

| EP | 1 049 144 | 11/2000 |
|---|---|---|
| JP | 07-130652 | 5/1995 |
| JP | 08-078329 | 3/1996 |
| JP | 2000-068520 | 3/2000 |

OTHER PUBLICATIONS

Geis et al., "Crystalline Silicon on Insulators by Graphoepitaxy," IEEE 1979, pp. 210-212.

(Continued)

*Primary Examiner*—Chuong A. Luu
(74) *Attorney, Agent, or Firm*—Eric J. Robinson; Robinson Intellectual Property Law Office, P.C.

(57) ABSTRACT

An object of the present invention is to provide a semiconductor device formed by laser crystallization by which formation of grain boundaries in the TFT channel formation region can be avoided, and a method of manufacturing the same. Still another object of the present invention is to provide a method of designating the semiconductor device. The present invention relates to a semiconductor device with a plurality of cells each having a plurality of TFTs that have the same channel length direction, in which the plural cells form a plurality of columns along the channel length direction, in which an island-like semiconductor film of each of the plural TFTs is crystallized by laser light running in the channel length direction, in which a channel formation region of the island-like semiconductor film is placed on a depressive portion of a base film that has a rectangular or stripe pattern concave and convex with the channel length direction matching the longitudinal direction of the depressive portion, and in which a plurality of wires for electrically connecting the plural cells with one another are formed between the plural columns.

27 Claims, 26 Drawing Sheets

U.S. PATENT DOCUMENTS

| | | | |
|---|---|---|---|
| 5,981,974 A | 11/1999 | Makita | |
| 5,986,306 A | 11/1999 | Nakajima et al. | |
| 6,410,368 B1 | 6/2002 | Kawasaki et al. | |
| 6,429,100 B2 | 8/2002 | Yoneda | |
| 6,528,397 B1 | 3/2003 | Taketomi et al. | |
| 6,961,361 B1 * | 11/2005 | Tanaka | 372/101 |
| 7,151,015 B2 * | 12/2006 | Suzawa et al. | 438/149 |
| 2003/0141505 A1 | 7/2003 | Isobe et al. | |
| 2003/0141521 A1 | 7/2003 | Isobe et al. | |
| 2003/0181043 A1 | 9/2003 | Tanada et al. | |
| 2003/0183875 A1 | 10/2003 | Isobe et al. | |
| 2003/0186490 A1 | 10/2003 | Kato et al. | |
| 2003/0209710 A1 | 11/2003 | Yamazaki et al. | |
| 2003/0218170 A1 | 11/2003 | Yamazaki et al. | |
| 2003/0218171 A1 | 11/2003 | Isobe et al. | |
| 2003/0218177 A1 | 11/2003 | Yamazaki | |
| 2003/0219935 A1 | 11/2003 | Miyairi et al. | |
| 2003/0230749 A1 | 12/2003 | Isobe et al. | |
| 2003/0230750 A1 | 12/2003 | Koyama et al. | |
| 2004/0016958 A1 | 1/2004 | Kato et al. | |
| 2004/0016967 A1 | 1/2004 | Yamazaki et al. | |
| 2004/0026696 A1 | 2/2004 | Yamazaki et al. | |
| 2004/0072411 A1 | 4/2004 | Azami et al. | |

OTHER PUBLICATIONS

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

H. W. Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1980, pp. 206-208.

Henry I. Smith et al., *Oriented Crystal Growth on Amorphous Substrates Using Artificial Surface-Relief Gratings*, Appl. Phys. Lett. 32(6), Mar. 1978, pp. 349-350.

D.K. Biegelsen et al., *Laser-Induced Crystallization of Silicon Islands on Amorphous Substrates: Multilayer Structures*, Appl. Phys. Lett. 38(3), Feb. 1981, pp. 150-152.

\* cited by examiner 8002 8001

2 μm

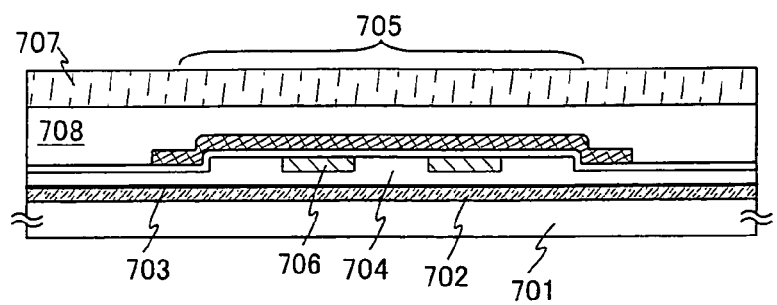
Fig. 26A
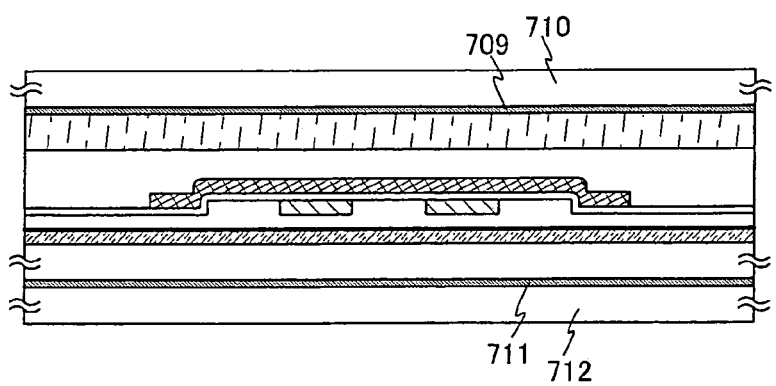
Fig. 26B
Fig. 26C
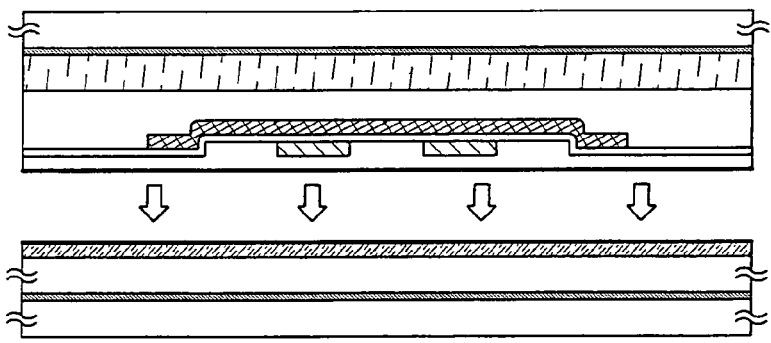
Fig. 26D
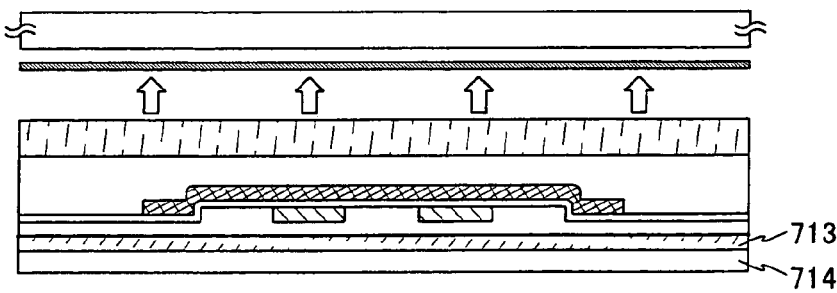
Fig. 26E
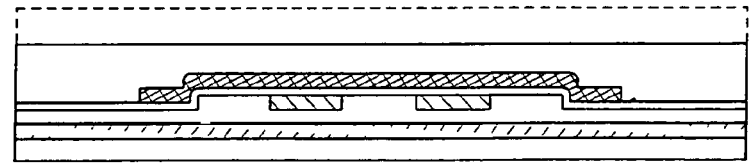

SEMICONDUCTOR DEVICE, METHOD OF MANUFACTURING THE SAME, AND METHOD OF DESIGNING THE SAME

This application is a divisional of Ser. No. 10/395,310 filed on Mar. 25, 2003, now U.S. Pat. No. 6,875,998.

BACKGROUND OF THE INVENTION

1. Field of the Invention

The present invention relates to a semiconductor device that uses a crystalline semiconductor film obtained through crystallization on an insulating surface by using a laser light and to a manufacturing method thereof.

2. Description of the Related Art

Conventionally, a semiconductor display device as an example of semiconductor devices has a drive circuit formed on a silicon substrate, which is connected to a pixel portion on a glass substrate via an FPC and the like; However, ICs are connected to the glass substrate on which the pixel portion is formed via the FPC and the like, there arises a problem in that a connected portion is weak against any physical impact. In particular, as the number of pins of the FPC increases, there is growing tendency for the connected portion to exhibit a poor property against the physical impact.

Then, techniques of integrating a drive circuit and a controller of the semiconductor display device with the pixel portion on the same glass substrate (system on glass) have been put into active research and development. The realization of the system on glass makes it possible to avoid the aforementioned problem by reducing the number of pins of the FPC as well as to reduce a size of the semiconductor display device itself. Further, since the glass substrate is cheaper than the mono-crystalline silicon substrate, it is possible to reduce manufacturing costs of the semiconductor display device.

For example, in a case of an active matrix liquid crystal display device as an example of the semiconductor display devices, a scanning line drive circuit and a signal line drive circuit are formed on the same glass substrate, the scanning line drive circuit being used for sequentially selecting one or more pixels among the plural pixels formed in the pixel portion and the signal line drive circuit being used for inputting signals (video signals) having image information to the selected pixels. This makes it possible to enhance resistance to the physical impact in the liquid crystal display device and to reduce the size of the liquid crystal display device itself.

Further, in recent years, integral formation of the controller, a CPU and the like, which has been conventionally formed on the silicon substrate, on the glass substrate, is being attempted in addition to the drive circuit. If both of the controller and the drive circuit can be integrally formed on the glass substrate on which the pixel portion is formed, the size of the semiconductor display device can be remarkably reduced and the resistance to the physical impact can be further enhanced.

Further, a glass substrate is inferior in heat resistance and is easily subjected to thermal deformation. Therefore, in the case where a crystalline TFT is formed on the glass substrate, in order to avoid thermal deformation of the glass substrate, the use of laser annealing for crystallization of a semiconductor film is extremely effective. Laser annealing has characteristics such as remarkable reduction of processing time compared to an annealing method utilizing radiant heating or conductive heating. In addition, a semiconductor or a semiconductor film is selectively and locally heated so that a substrate is scarcely thermally damaged.

Note that the term "laser annealing method" herein indicates a technique of recrystallizing a damaged layer formed on a semiconductor substrate or on a semiconductor film, and a technique of crystallizing an amorphous semiconductor film formed on a substrate. This also includes a technique that is applied to leveling or improvement of a surface quality of the semiconductor substrate or the semiconductor film. Applicable laser oscillation apparatuses include: gas laser oscillation apparatuses represented by an excimer laser; and solid laser oscillation apparatuses represented by a YAG laser. It is known that such an apparatus performs laser light irradiation to thereby heat a surface layer of the semiconductor in an extremely short period of time of about several tens of nanoseconds to several tens of microseconds for crystallization.

In general, the crystalline semiconductor films formed by using the laser annealing method are formed of an aggregation of plural crystal grains. The crystal grains develop randomly in position and size thereof. Thus, it is difficult to form the crystalline semiconductor film while designating the position and the size of the crystal grains. As a result, in an active layer formed by patterning the crystalline semiconductor film into an island-like shape, an interface (grain boundary) of the crystal grains may exist.

Note that the term grain boundary, which is also called a crystal grain boundary, refers to one of lattice defects categorized as a plane defect. The plane defect includes not only the grain boundary but also a twin plane, a stacking fault, or the like. In this specification, the plane defects having electrical activity and dangling bonds, i.e., the grain boundary and the stacking fault are collectively called the grain boundary.

Differing from the inside of the crystal grain, the grain boundary includes a number of recombination centers and trapping centers due to an amorphous structure, crystal defect, or the like. When carriers are trapped in the trapping center, a potential of the grain boundary increases, which serves as a barrier against the carriers. As a result, it is known that the carriers are decreased in current transporting characteristics. Thus, for example, in the case where the TFT is formed as a semiconductor device, when the grain boundary exists in the active layer, particularly in a channel formation region, it significantly affects the characteristics of the TFT as follows. That is, mobility of the TFT is remarkably decreased, an ON current is decreased, an OFF current is increased due to the current flowing through the grain boundary, and the like. Also in the plural TFTs manufactured on the assumption that the same characteristics can be obtained, the characteristics may vary depending on whether or not the grain boundary is included in the active layer thereof.

When the laser light is irradiated onto the semiconductor film, the crystal grains are obtained randomly in terms of position and size on the grounds listed below. That is, it takes a certain amount of time for the nucleation of solid phase to develop in the completely melted semiconductor film in a liquid form due to the laser light irradiation. Then, a number of crystal nuclei are generated with time in the completely melted region and crystal growth occurs from each of the crystal nuclei. The crystal nuclei are generated in random positions and thus, distributed in a nonuniform manner. The crystal growth terminates at a position where the crystal grains are abutted against each other, so that the crystal grains develop randomly in position and size.

The transistor used in a drive circuit, a controller and a CPU is required to operate at high speed. As described above, however, it is difficult to form the single crystal silicon film having no grain boundary by the laser annealing method. The TFT using as the active layer the crystalline semiconductor film crystallized by the laser annealing method, which has characteristics equivalent to those of a MOS transistor formed on the single crystal silicon substrate has not been realized so far.

In view of the above-mentioned problems, a second object of the present invention is to provide a manufacturing method for a semiconductor device using a laser crystallization method, which can prevent a grain boundary from developing in a channel formation region of a TFT and avoid a remarkable reduction in mobility of the TFT due to the grain boundary, a decrease in an ON current, and an increase in an OFF current and to provide a semiconductor device manufactured by using the manufacturing method. Moreover, the present invention is to provide a designing method for a semiconductor device using aforementioned crystallization method.

The applicants of the present invention discovered that if a semiconductor film is formed on an insulating film having unevenness, and laser light is irradiated to the semiconductor film, then grain boundaries are selectively formed on portions, which are located on projective portions of the insulating film, of the crystallized semiconductor film.

FIG. 19 shows a TEM image of a test piece, seen from above, when continuous wave laser light having an output energy of 5.5 W is irradiated to a 150 nm thick amorphous semiconductor film, which is formed on a base film having unevenness, along a longitudinal direction of the projective portions with a scanning speed of 50 cm/sec. Further, the TEM image shown in FIG. 20 schematically shows the TEM image shown in FIG. 19 for easier explanation thereof to be understood.

Among semiconductor films in FIG. 19 and FIG. 20, a region denoted by the reference numeral 8001 corresponds to a portion located on a portion of the projective portion, and a region denoted by reference numeral 8002 corresponds to a portion located on a portion of the depressive portion. The term depressive portion indicates a depressed region on which the projective portion is not formed. The width of a projective portion is 0.5 µm, the width of a depressive portion is 0.5 µm, and the thickness of the projective portion is 250 nm. As shown in FIG. 20, a grain boundary 8003 is formed in the semiconductor film on the projective portion.

FIG. 21 shows a TEM image; in its cross section in a direction orthogonal to a laser light scanning direction, of a test piece, which is manufactured under the same conditions as those for the test piece shown in FIG. 19 and then undergoes Secco etching. A base film having unevenness is formed of a three layer insulating film. A second insulating film made from silicon oxide having a stripe pattern is formed on a first insulating film made of silicon nitride, and a third insulating film made of silicon oxide is formed covering the first insulating film and the second insulating film.

Note that Secco etching is performed at room temperature for 75 seconds using an aqueous solution mixed with $K_2Cr_2O_7$ and HF.

A grain boundary 8005 on a projective portion 8009 is expanded by Secco etching, and its position becomes clearer, as shown in FIG. 21. Note that a white portion visible within the projective portion 8009 shows the region that silicon oxide is etched through the grain boundary due to the semiconductor film grain boundary which is expanded by Secco etching. Also, by irradiating the laser light, the surface of the semiconductor film 8006 is leveled.

Further, FIG. 22 shows a TEM image, which is seen from above, of a test piece which is manufactured by the same conditions as those for the test pieces shown in FIG. 19 and FIG. 21 and undergoes Secco etching. The Secco etching conditions are the same as those of FIG. 21. A region denoted by reference numeral 8501 corresponds to a semiconductor film located on a projective portion, and a region denoted by reference numeral 8502 corresponds to a portion located on a depressive portion. A white portion 8503 visible in the portion located in the upper portion of the projective portion 8501 shows a portion in which a grain boundary of the semiconductor film is etched and expanded by Secco etching, and it becomes clear that the grain boundary is selectively formed on the upper portion of the projective portion 8501.

From this fact, the applicants of the present invention consider that one of the causes of the grain boundary developing on the projective portion is that: volumetric movement of the semiconductor film, which is located on the upper portion of the insulating film, toward the direction of a bottom portion of the depressive portion occurs due to the semiconductor film temporarily melting through the laser light irradiation; and therefore the semiconductor film located on the projective portion becomes thinner and unable to withstand stress.

Further, simulation results for temporal changes in a temperature distribution in a semiconductor film formed on an insulating film having unevenness during laser light irradiation to the semiconductor film are shown in FIGS. 23A to 23F. Line 8008 which is unevenness on a lower side of the graphs stands for a boundary between a base film formed of an oxide film and silicon. Further, an upper side line 8009 is a boundary between silicon and an air layer. And laser light is irradiated to the surface of the silicon which is line 8009.

The oxide film thickness and the silicon film projective portion thickness are each 200 nm, and the gap between the concave and the convex is 1 µm. The laser light irradiation conditions were, with Gaussian, a peak energy density of 45,000 W/cm$^2$ and σ=7×10$^{-5}$ sec.

FIG. 23A shows a temperature distribution immediately after laser light irradiation, and FIGS. 23B to 23F show temperature distributions at 2.5 µsec intervals thereafter.

Regions shown by dark colors are portions that can be considered to have the highest temperature, and it can be seen that the dark colored portions become fewer as the state shifts from FIG. 23A to FIG. 23F. Regarding the temperature of the silicon which is between line 8008 and line 8009, it can be seen that, as time passes, portions on depressive portions of the base film shown by the line 8008 have temperature reduction before portions on projective portions of the base film 8008.

FIG. 24 shows simulation results for temporal changes in temperature due to location of a semiconductor film in irradiating laser light to the semiconductor film formed on an insulating film having unevenness.

A graph shown in FIG. 24 shows a semiconductor film temperature (K) on its vertical axis, and time (second) on its horizontal axis. A solid line shows the temperature of the semiconductor film located on a projective portion, and a dashed line shows the temperature of the semiconductor film located on a depressive portion. In the simulation shown in FIG. 24, temperature reduction temporarily stops along with a phase transformation at 1600 K, but after the phase transformation, the semiconductor film on the depressive portion which is shown by the dashed line begins dropping in temperature ahead of the semiconductor film on the projective portion, and it can be understood that the semiconductor film on the depressive portion undergoes earlier phase transformation.

The vicinity of the depressive portion a larger volume of the insulating film within a fixed range, so is has a larger heat capacity than the vicinity of the projective portion. That is because it is difficult for escaped heat to remain, and heat radiation is performed efficiently. Thus, after the semiconductor film melts due to the irradiation of laser light, in the process that heat within the semiconductor film is radiated to the insulating film to be solid, crystal nuclei tend to develop earlier in the vicinity of the depressive portion than the vicinity of the projective portion.

Crystal growth proceeds as time passes, from the crystal nuclei generated in the vicinity of the depressive portion toward the projective portion. One cause of grain boundaries developing on the projective portion can be considered to be the fact that crystal growths advancing from adjacent depressive portions come together on the projective portion between the two depressive portions.

Whatever the cause, the grain boundaries are selectively formed in upper portions of the projective portions while the grain boundaries tend not to be formed in portions located in the depressive portions on the semiconductor films thus crystallized.

From the semiconductor film crystallized by laser light, the applicants of the present invention considered using the portions formed on the depressive portions as a channel formation region of TFT.

Continuous wave laser light is most preferably used as the laser light, but pulse wave laser light may also be used. Note that it is preferable for a cross section of the projective portion in a direction orthogonal to the laser light scanning direction to be a quadrilateral shape, including a rectangular shape, or a triangular shape.

In accordance with the aforementioned structure, grain boundaries are selectively formed in the semiconductor films located on the projective portions of the insulating film when performing crystallization through laser light irradiation. Note that, although the semiconductor films located on the depressive portions of the insulating film have superior crystallinity since it is relatively difficult for grain boundaries to be formed therein, they do not always contain zero grain boundaries. However, it can be said that, even if grain boundaries do exist, crystal grains are larger, and the crystallinity is relatively superior, compared to the semiconductor films located on the projective portions of the insulating film. The locations at which grain boundaries are formed in the semiconductor films can therefore be predicted to a certain extent at the insulating film shape design stage. That is, the locations at which grain boundaries are formed can be set selectively with the present invention, and therefore it becomes possible to lay out the active layer such that, as much as possible, grain boundaries are not contained in the active layer, more preferably in channel formation regions.

The formation of grain boundaries in the TFT channel formation region can be avoided with the present invention by actively using the island-like semiconductor films located on the depressive portions of the insulating film as the TFT active layers. Substantial reduction in TFT mobility, reduction in ON current, and increase in OFF current due to the grain boundaries can be avoided.

Furthermore, the crystallinity of the active layer is enhanced and therefore a desired ON current value is obtained even when the active layer is small in size. Accordingly, the area of the whole circuit can be made small as well as the size of the semiconductor device.

When a semiconductor film crystallized by the above method is used in an integrated circuit which is one of semiconductor devices, there are some design restrictions, which are listed below.

1: The laser light scanning direction has to match the direction in which carriers move in a channel formation region of each TFT (channel length direction).
2: Laser light edges should not overlap an active layer of each TFT.
3: An active layer or a channel formation region has to be placed in a depressive portion of the base film.

To reduce complexity of the integrated circuit layout while abiding by the above three restrictions, the present invention uses the following designing method in manufacture of an integrated circuit.

The first step in designing an integrated circuit according to the present invention is to figure out what kinds of logic elements (hereinafter referred to as cells) constitute the integrated circuit and how many are used at the stage of logical calculus.

Then layout of a mask in each cell is determined. At this point, every mask has to be placed in the same direction in order to make the channel length direction of every TFT match the laser light scanning direction. Furthermore, the mask has to be placed such that an active layer or channel formation region of each TFT in each cell is formed from a semiconductor film that is on a depressive portion of a base film. By giving every TFT the same channel length direction, characteristic fluctuation between TFTs in the same cell can be avoided. Moreover, the use of a semiconductor film that is on a depressive portion prevents grain boundaries from forming in a channel formation region of a TFT. This makes it possible to avoid a significant drop in TFT mobility, reduction of ON current, and increase in OFF current which are caused by grain boundaries.

Then the only thing left to complete the objective integrated circuit layout is to combine a desired number of cells from various kinds of cells whose layout has already been determined and decide electrical connection between the cells. The various kinds of cells that constitute the integrated circuit are arranged so as to form stripe pattern columns along the longitudinal direction of the concave and convex of the base film, or the laser light scanning direction. In this specification, a group of cells arranged into a column is hereinafter referred to as cell column and the direction in which the cells are lined up will be called a cell column direction. Accordingly, the cell column direction is set equal to the longitudinal direction of the concave and convex of the base film and the laser light scanning direction. In addition, the channel length direction in each cell has to match the longitudinal direction of the concave and convex of the base film, the laser light scanning direction, and the cell column direction. These are important points in arranging the cells.

For every cell in the same cell column, the width in the direction perpendicular to the cell column direction (hereinafter referred to as cell width) should not exceed a certain range. A common voltage may be supplied from a power supply to every cell in the same cell column or different voltages may be supplied.

It is important to design the integrated circuit such that the cell width is smaller than the width of laser light in the direction perpendicular to the scanning direction. Strictly speaking, of a region irradiated with laser light, a region having a uniform energy density has to have a width in the direction perpendicular to the scanning direction that is smaller than the cell width.

Generally, laser light is lower in energy density near its edges than around its center. Accordingly, a semiconductor film crystallized by edges of laser light has poor crystallinity compared to one crystallized by the center of laser light. When running laser light over a semiconductor film, edges of laser light track therefore should not overlap a portion of the semiconductor film that later becomes a channel formation region of a TFT, more desirably, an active layer of the TFT. By designing the cell width smaller than the width of a laser light region having a uniform energy density in the direction perpendicular to the scanning direction, the semiconductor film crystallinity can be uniform throughout a cell and among cells and characteristic fluctuation between TFTs is avoided.

The cell width can be set wider when the width of a region having a uniform energy density in the direction perpendicular to the scanning direction is wider. A larger cell width means fewer restrictions in layout of TFTs in a cell and less complexity in design. Therefore it is desirable to use laser light that is rectangular or linear in section.

After layout is determined for all the cells, wires for electrically connecting the cells with one another are arranged between cell columns. When crystallizing the semiconductor film with laser light, laser light edges can overlap regions where the wires are placed without causing any problem. This is because the portions of the semiconductor film in these regions are removed in a later step and are not used as circuit elements.

With the above structure, laser light edges (seams) are readily prevented from overlapping cells and complex layout can be avoided. Moreover, no laser light is wasted on irradiating a region where no cell column is formed because regions having cell columns alone are irradiated with laser light. In other words, the above structure makes it easy to run laser light only over necessary regions for the minimum degree of crystallization. As a result, time required for laser light irradiation is shortened and the substrate processing speed is improved.

In this way, a desired number of cells from various kinds of cells whose layout has already been determined are combined to form cell columns and connection between cells is determined to build an objective integrated circuit. Thus design complexity of an integrated circuit can be reduced and the circuit layout is obtained efficiently while abiding by the above restrictions 1 through 3.

In addition, portions of the laser light which have a low energy density may also be blocked through a slit. Laser light having a relatively uniform energy density can be irradiated to the cell columns by using the slit, and crystallization can be performed uniformly. Further, the width of the laser light can be partially changed in accordance with the cell width by forming the slit, and in addition, restrictions on the layout of channel formation regions, and the layout of TFT active layers can be reduced. Note that the term laser light width refers to the length of the laser light in a direction orthogonal to the scanning direction.

Further, one laser beam obtained by synthesizing laser light emitted from a plurality of laser oscillation devices may also be used in laser crystallization. Portions having weak energy density in each of the laser lights can be mutually compensated for by using the above structure thereby obtaining a linear or a rectangular laser beam.

Further, the semiconductor film may also be crystallized by performing the irradiation of laser light without exposure to the atmosphere (for example, by using a specific gas atmosphere such as an inert gas, nitrogen, or oxygen, or a reduced pressure atmosphere) after film formation of the semiconductor film. Contaminants at the molecular level within a clean room, for example, boron contained within a filter used for increasing the cleanliness of air can be prevented from contaminating the semiconductor film when performing crystallization with laser light under the aforementioned structure.

If a flexible substrate is used to manufacture a semiconductor device, stress applied to a base film upon an increase in curvature of the substrate can be dispersed to a certain degree by matching the longitudinal direction of a projective portion of the base film with the direction of bus of the bent substrate.

BRIEF DESCRIPTION OF THE DRAWINGS

In the accompanying drawings:

FIGS. 26A to 26E are diagrams showing a process of manufacturing a semiconductor display device of the present invention.

DETAILED DESCRIPTION OF THE PREFERRED EMBODIMENTS

Embodiment Mode

A description is given on a method of manufacturing a semiconductor display device of the present invention.

Figure 1A:
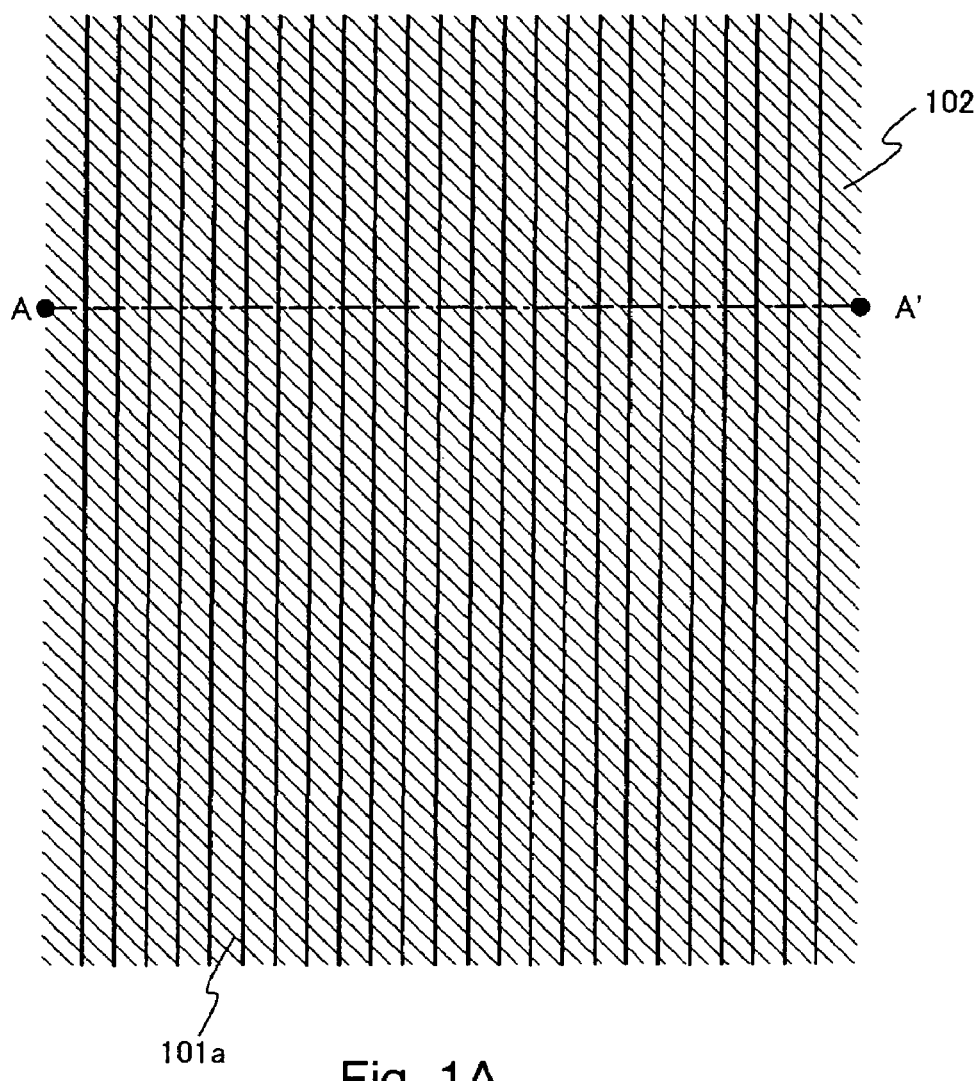
FIGS. 1A and 1B are diagrams showing a process of manufacturing a semiconductor display device of the present invention.
Figure 1B:
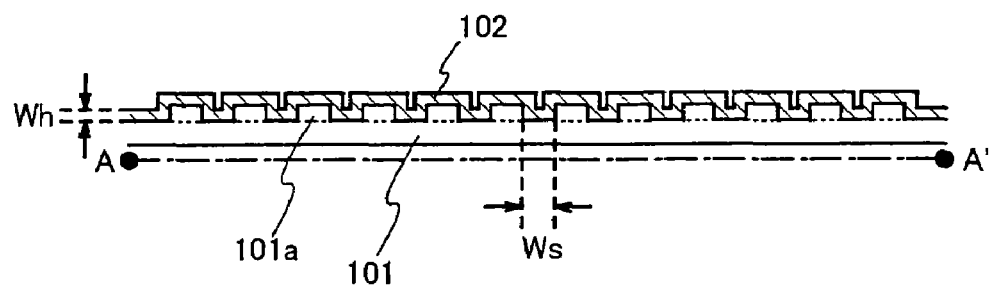

First, as shown in FIG. 1A, a base film 101 having rectangular or stripe pattern projective portions 101a is formed on a substrate. A sectional view taken along the line A-A' in FIG. 1A corresponds to FIG. 1B.

The substrate (not shown in the drawing) is formed of a material that can withstand against the treatment temperature in later steps. For instance, a quartz substrate, silicon substrate, glass substrate, metal substrate, or stainless steel substrate with an insulating film formed on its surface can be employed. Examples of the glass substrate include a barium borosilicate glass substrate and an alumino borosilicate glass substrate. A plastic substrate may also be used as long as it has heat resistance that can withstand the treatment temperature.

The base film 101 is an insulating film which can withstand heat treatment in later steps, which can prevent an alkaline metal that affects TFT characteristics from entering a semiconductor film formed later, and which can form concave and convex. If it is necessary to remove projective portions alone in a later step, the material of the projective portions of the base film has to have a selective ratio in etching with respect to the material of the rest. How the concave and convex is formed will be described later in detail. The base film 101 may be a laminate of two or more layers of insulating films instead of a single-layer insulating film.

Next, a semiconductor film 102 is formed so as to cover the base film 101. A known method (sputtering, LPCVD, plasma CVD, or the like) can be used to form the semiconductor film 102. The semiconductor film 102 can be an amorphous semiconductor film, a microcrystalline semiconductor film, or a crystalline semiconductor film. Silicon or silicon germanium can be used for the semiconductor film 102. When silicon germanium is chosen, the concentration of germanium is preferably 0.01 to 4.5 atomic %. The base film 101 and the semiconductor film 102 are formed in succession without exposing the substrate to the air, so that no impurities are held between the semiconductor film and the base film.

Effects of the present invention cannot be obtained if the width between the projective portions is too large or too small. Also, too tall projective portions can cause discontinuity in a semiconductor film formed later in the vicinity of edges of the projective portions. On the other hand, too short projective portions are a hindrance in obtaining the effects of the present invention. The sectional shape and size of the projective portions 101a can be set at designer's discretion taking into consideration the balance between the thickness of the semiconductor film and laser light irradiation conditions. A width Ws between the projective portions is desirably set to 0.01 to 2 µm, more desirably 0.1 to 1 µm. A height Wh of the projective portions is desirably set to 0.01 to 3 µm, more desirably 0.1 to 2 µm. Alternatively, the height Wh of the projective portions may be shorter and set to 0.01 to 1 µm, desirably 0.05 to 0.2 µm.

Figure 2A:
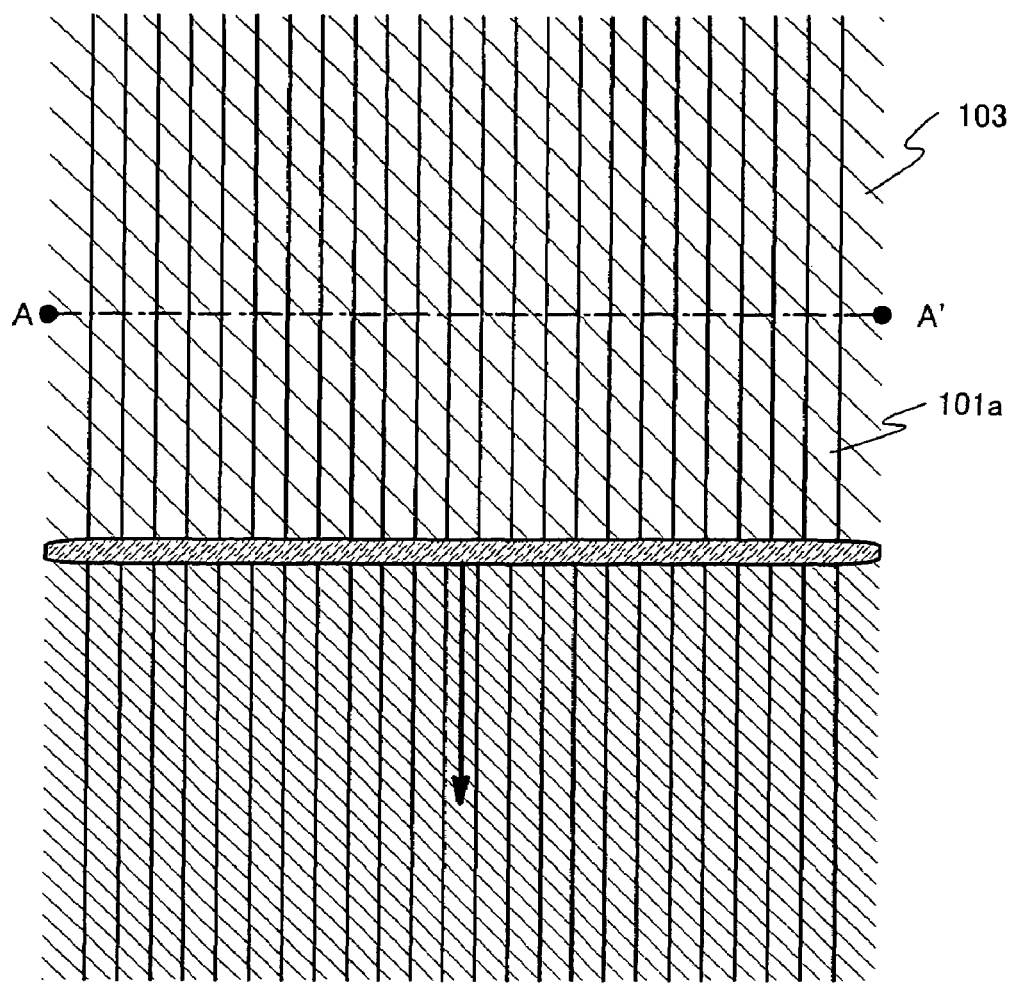
FIGS. 2A and 2B are diagrams showing a process of manufacturing a semiconductor display device of the present invention.

Next, the semiconductor film 102 is irradiated with laser light as shown in FIG. 2A. A sectional view taken along the dashed line in FIG. 2A corresponds to FIG. 2B.

Figure 2B:
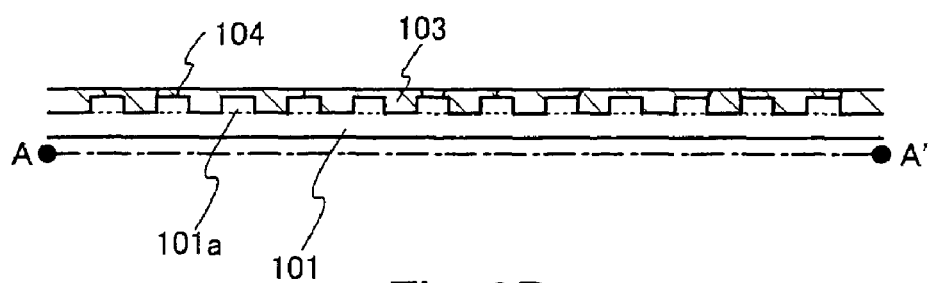

In this embodiment mode, the semiconductor film is irradiated with laser light with the scanning direction set to the longitudinal direction of the rectangular or stripe pattern projective portions 101a as indicated by the arrow in FIG. 2A. Through the laser light irradiation, the semiconductor film 102 is melted temporarily and its volume shifts from the top of the projective portions toward the depressive portions as shown in FIG. 2B. Thus obtained is a semiconductor film 103 with a leveled surface and enhanced crystallinity.

A known laser can be employed in the present invention. Although continuous wave laser light is preferred, a pulse oscillation laser could provide the effects of the present invention to a certain degree if the irradiation conditions including the energy density and the scanning speed are right. A gas laser or a solid-state laser can be employed. Examples of the gas laser include an excimer laser, an Ar laser, and a Kr laser. Examples of the solid-state laser include a YAG laser, a $YVO_4$ laser, a YLF laser, a $YAlO_3$ laser, a glass laser, a ruby laser, an alexandrite laser, and a Ti:sapphire laser. The solid-state laser employed uses a crystal such as YAG, $YVO_4$, YLF, or $YAlO_3$ doped with Cr, Nd, Er, Ho, Ce, Co, Ti, or Tm. The fundamental wave of the laser is about 1 µm, although depending on the material used for doping. Harmonic of the fundamental wave is obtained through a non-linear optical element.

It is also possible to use ultraviolet laser light which is obtained by using a non-linear optical element to convert infrared laser light that is emitted from a solid-state laser into green laser light and then using another non-linear optical element to convert the green laser light.

Through the volume shift by the laser light irradiation, the semiconductor film 103 becomes thicker on the depressive portions of the base film 101 and thinner on the projective portions 101a. Accordingly, grain boundaries 104 are likely to appear on the projective portions 101a due to stress while giving excellent crystallinity to the semiconductor film on the depressive portions. It is not that the semiconductor film 103 on the depressive portions is completely free of grain boundaries. However, even when it has a grain boundary, the grain size is large and therefore the crystallinity is still superior.

In crystallizing the semiconductor film, laser light irradiation may be combined with crystallization of a semiconductor film that uses a catalyst. When using a catalytic element for crystallization, the techniques disclosed in JP 07-130652 A and JP 08-78329 A will be helpful.

Figure 3A:
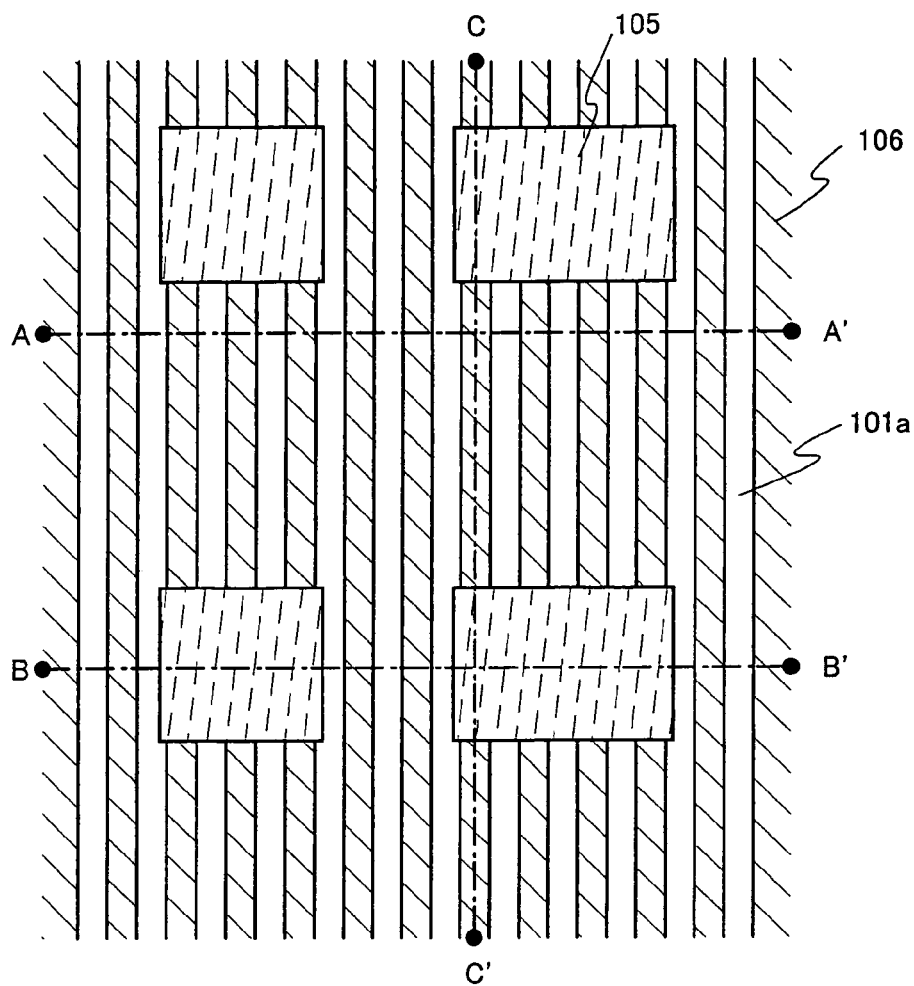
FIGS. 3A to 3D are diagrams showing a process of manufacturing a semiconductor display device of the present invention.

Next, the surface of the semiconductor film 103 is etched as shown in FIG. 3A to expose top faces of the projective portions 101a of the base film 101. In this embodiment mode, portions of the semiconductor film that serve as source regions and drain regions of TFTs are covered with masks 105 before etching to avoid etching these portions.

Figure 3B:
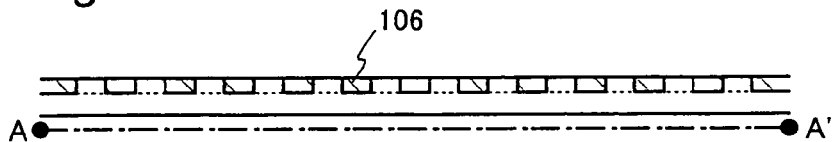
Figure 3C:
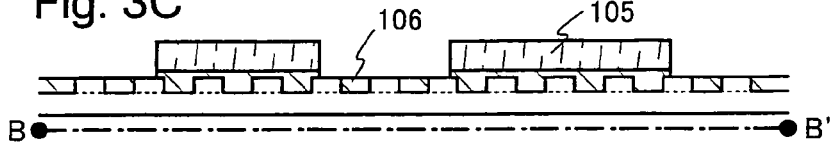
Figure 3D:
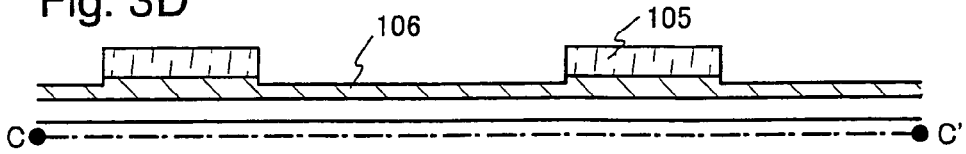

FIG. 3B corresponds to a sectional view taken along the dashed line A-A' in FIG. 3A. FIG. 3C is a sectional view taken along the dashed line B-B' in FIG. 3A. FIG. 3D is a sectional view taken along the dashed line C-C' in FIG. 3A. With the top faces of the projective portions 101a exposed through the above step, a semiconductor film 106 is obtained which is partially divided into pieces on the depressive portions.

The removal of the semiconductor film from the top faces of the depressive portions 101a means removal of portions of the semiconductor film that contain grain boundaries from areas where channel formation regions of TFTs are to be formed. Accordingly, a semiconductor film with excellent crystallinity is formed on the depressive portions that are between the projective portions 101a, and later used as the channel formation regions.

Figure 4A:
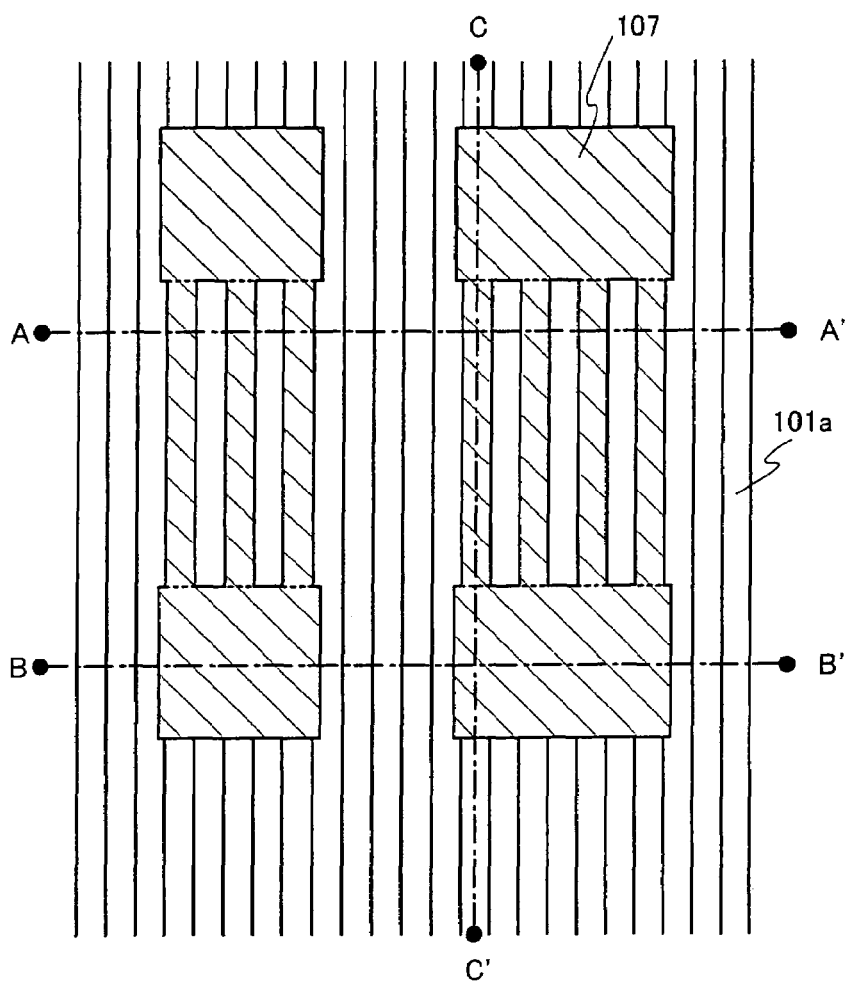
FIGS. 4A to 4D are diagrams showing a process of manufacturing a semiconductor display device of the present invention.
Figure 4B:
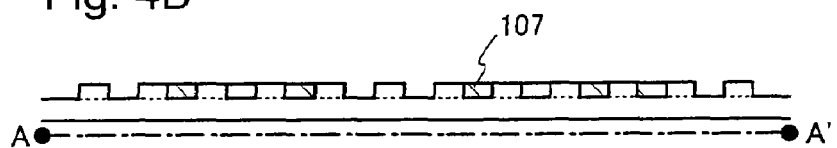
Figure 4C:
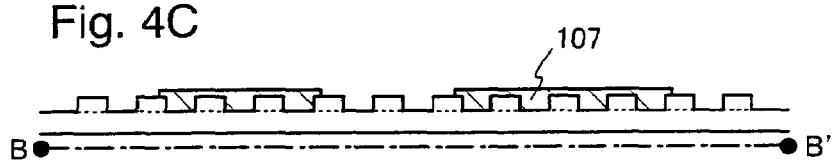
Figure 4D:
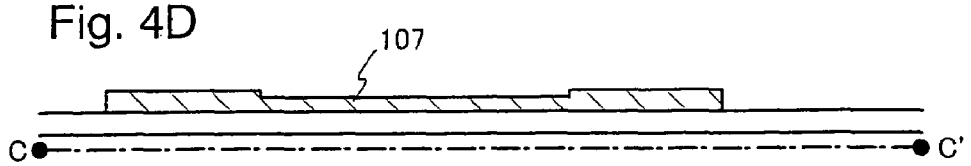

The semiconductor film 106 is then patterned as shown in FIG. 4A to form an island-like semiconductor film 107, which serves as an active layer. FIG. 4B corresponds to a sectional view taken along the dashed line A-A' in FIG. 4A. FIG. 4C is a sectional view taken along the dashed line B-B' in FIG. 4A. FIG. 4D is a sectional view taken along the dashed line C-C' in FIG. 4A. A TFT formed in this embodiment mode is of so-called multi-channel type, and channel formation regions alone are separated in the island-like semiconductor film 107 to present a slits-like look. Specifically, portions of the island-like semiconductor film 107 that serve as a source region and a drain region are covered with the masks 105 to avoid being etched and are positioned on the projective portions 101a. One TFT has plural channel formation regions that are separated from one another and a source region and a drain region which sandwich all of the channel formation regions. The channel formation regions are all placed on the depressive portions instead of the projective portions 101a. In portions that serve as a source region and a drain region, the semiconductor film crystallinity does not have as much influence on the TFT characteristic as it does in channel formation regions. Accordingly, no serious problem arises if the crystallinity of the portions that serve as a source region and a drain region is poor compared to the crystallinity of portions that serve as channel formation regions.

Although the TFTs in this embodiment mode are of multi-channel type, the present invention is not limited thereto. TFTs of single-channel type which has only one channel formation region may be employed instead.

Desirably, layout of the projective portions 101a is determined taking into consideration the channel length and channel width of a channel formation region of a TFT.

Figure 5A:
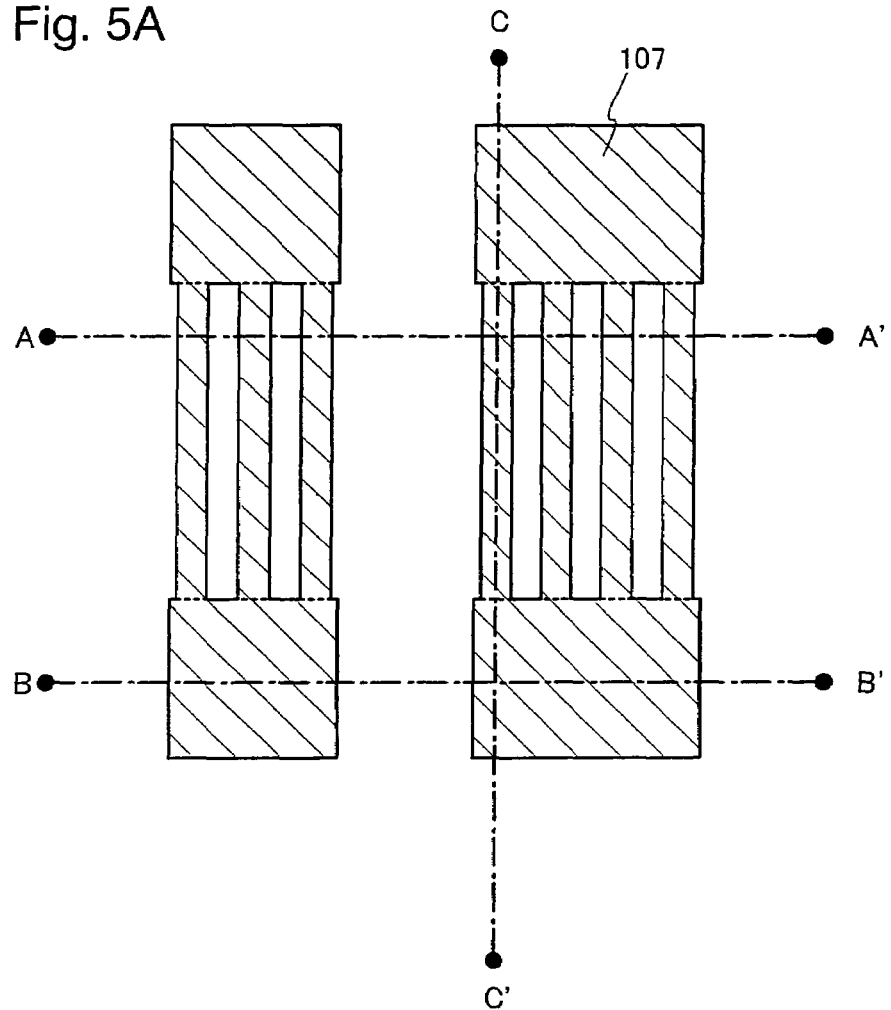
FIGS. 5A to 5D are diagrams showing a process of manufacturing a semiconductor display device of the present invention.
Figure 5B:
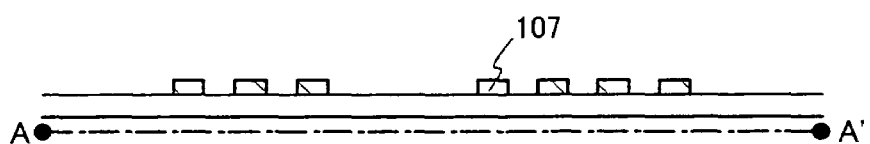
Figure 5C:
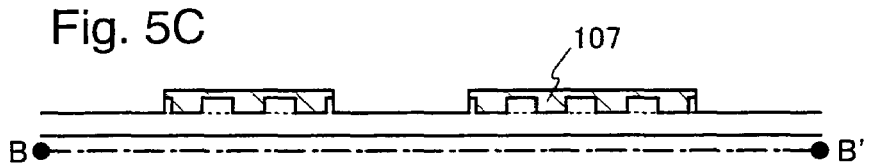
Figure 5D:
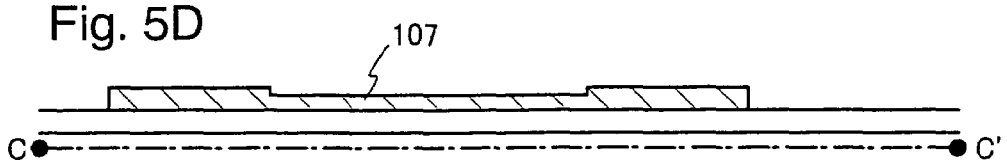

Next, some of the projective portions 101a of the base film 101 are removed as shown in FIG. 5A to expose portions of the island-like semiconductor film 107 that serve as channel formation regions. FIG. 5B corresponds to a sectional view taken along the dashed line A-A' in FIG. 5A. FIG. 5C is a sectional view taken along the dashed line B-B' in FIG. 5A. FIG. 5D is a sectional view taken along the dashed line C-C' in FIG. 5A. Dry etching or wet etching is used for the removal of the projective portions 101a. A method suited to the structure of the base film should be chosen, so that the projective portions alone are removed. During the etching, a part of the island-like semiconductor film 107 may be removed while some of the projective portions are left.

It is important to select materials such that the projective portions of the base film have selective ratio with respect to the island-like semiconductor film 107 in etching. For instance, if the base film is composed of three base films and the second base film is a rectangular silicon oxide film formed on the first base film which is a silicon nitride film while the third base film is formed of silicon oxide to cover the first and second base films, the second and third base films are removed preferably by dry etching using $CHF_3$ and $CF_3$ gases or wet etching using a hydrofluoric acid-based etchant. When dry etching is chosen, accidental etching of the base film under the island-like semiconductor film due to overflow is avoided and the side faces of the island-like semiconductor film can have a tapered shape. With the side faces of the island-like semiconductor film tapered, an insulating film and a gate electrode which are formed in later steps can be prevented from causing film discontinuation. On the other hand, when wet etching is chosen, the projective portions of the base film can be removed without etching the top face of the island-like semiconductor film.

With the projective portions removed, only portions of the semiconductor film on the depressive portions that have excellent crystallinity are used for channel formation regions of a multi-channel TFT. In addition, of the channel formation regions, a region that overlaps a gate electrode with a gate insulating film sandwiched therebetween can have a large area and therefore the channel width can be set large. A large channel width makes it possible to efficiently release heat generated by driving the TFT while securing ON current.

In this embodiment mode, of the projective portions of the base film, areas that are covered with portions of the island-like semiconductor film 107 that serve as a source region and a drain region are left unetched.

The island-like semiconductor film obtained through a series of steps described above is used as an active layer to manufacture a TFT. A TFT with a plurality of channel formation regions that are separated from one another can have various specific structures and can be made by various manufacture processes. Typically, a process of manufacturing this type of TFT includes a step of doping the island-like semiconductor film with an impurity to form a source region and a drain region, a step of forming a gate insulating film, and a step of forming a gate electrode.

This embodiment mode puts a step of forming an island-like semiconductor film by patterning after a step of removing a surface of a semiconductor film that has been crystallized by laser light until projective portions are exposed. However, the present invention is not limited thereto and the step of removing the surface of the island-like semiconductor film until the projective portions are exposed may be put after the step of forming the island-like semiconductor film by patterning. Alternatively, a semiconductor film may be patterned and then crystallized by a laser.

The present invention actively uses a portion of a semiconductor film that is positioned on a depressive portion of an insulating film for an active layer or channel formation region of a TFT, thereby eliminating grain boundaries from the channel formation region of the TFT. In this way, a significant drop in TFT mobility, reduction of ON current, and increase in OFF current which are caused by grain boundaries can be avoided and therefore characteristic fluctuation between TFTs is reduced.

After the TFTs are manufactured, a gate electrode, a source region, and a drain region are electrically connected by wires in each TFT in accordance with the specification of the objective circuit to obtain cells. Referring to FIGS. 6A to 6D, a description is given on an example of using the above TFTs to manufacture an inverter which is one of the cells.

Figure 6A:
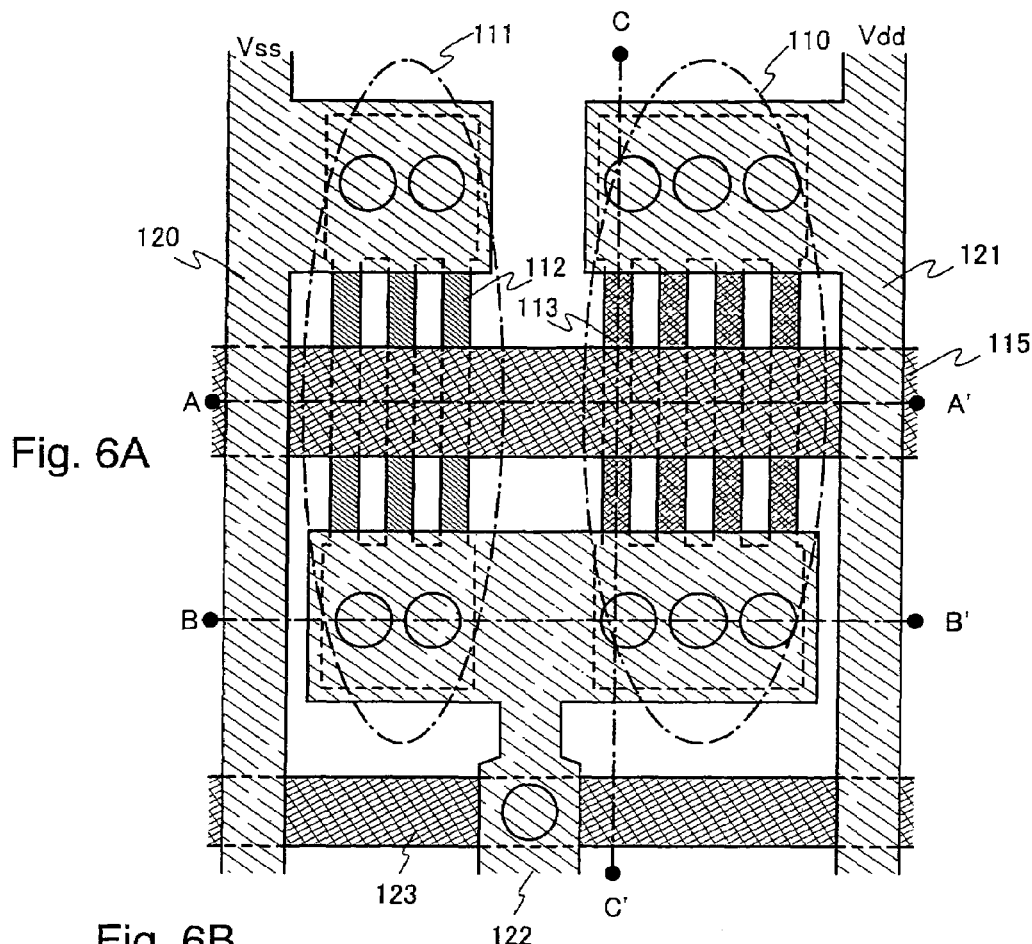
FIGS. 6A to 6D are a top view and sectional views of an inverter formed by a manufacturing method of the present invention.
Figure 6B:
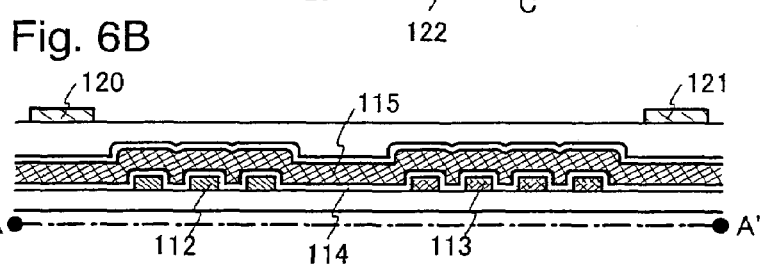
Figure 6C:
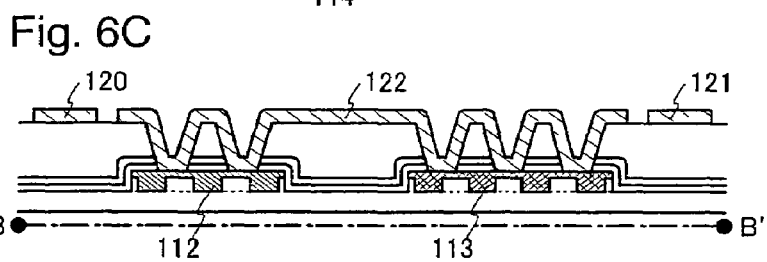
Figure 6D:
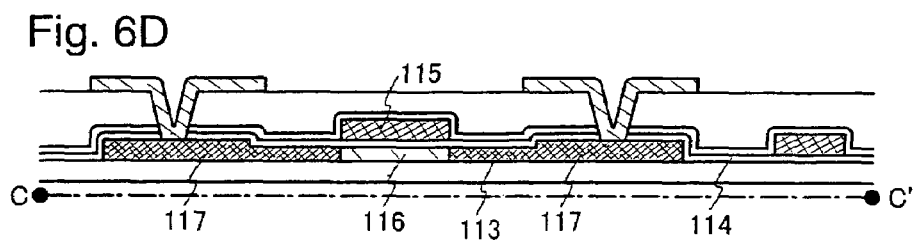

FIG. 6A is a top view of an inverter which is formed from the island-like semiconductor film 107 shown in FIGS. 5A to 5D. FIG. 6B corresponds to a sectional view taken along the dashed line A-A' in FIG. 6A. FIG. 6C is a sectional view taken along the dashed line B-B' in FIG. 6A. FIG. 6D is a sectional view taken along the dashed line C-C' in FIG. 6A.

This embodiment mode uses the island-like semiconductor film 107 formed by the above method to form a p-channel TFT 110 and an n-channel TFT 111. The TFTs 110 and 111 have at least active layers 113 and 112, respectively, in addition to a gate insulating film 114 and a gate electrode 115. The active layers 113 and 112 are obtained by doping the island-like semiconductor film 107 with an impurity. The active layers 113 and 112 each have at least a channel formation region 116 and a source region 117 and a drain region 117 which sandwich the channel formation region 116.

An LDD region or an offset region may be placed between a channel formation region and an impurity region that serves as a source region or a drain region.

The channel formation region of each TFT is placed only on a depressive portion. The source region or the drain region is connected to the gate electrode in each TFT through one of wires 120 to 123 to form an inverter. Specifically, a voltage Vss is applied to the wire 122 connected to the source region of the n-channel TFT 111, and a voltage Vdd is applied to the wire 121 connected to the source region of the p-channel TFT 110. Vss is smaller than Vdd. In sync with a signal inputted to the gate electrode 115, a signal at a voltage having the polarity reverse to the polarity of the former signal is outputted from the wire 123 through the wire 122 which is connected to the drain region of the p-channel TFT 110 and the drain region of the n-channel TFT 111.

In this specification, a voltage means an electric potential difference from the ground electric potential unless otherwise stated.

Cells used in the present invention are not limited to the above circuit. The layer in which the wires 120 to 123 in a cell are formed can have other structure than the one shown in FIGS. 5A to 5D. A layer in which wires for connecting TFTs in a cell are formed can be set at designer's discretion. However, since every cell in the same cell column has to receive the same power supply voltage and therefore wires for supplying the common power supply voltage, the wires 120 and 121 in FIGS. 6A to 6D, are shared by all cells in the same cell column.

In the above process, stress in the semiconductor film can be relieved by heating at 500 to 600° C. for 1 to 60 minutes after etching the semiconductor film that has been irradiated with laser light or crystallized until the projective portions of the base film are exposed.

Although the description given in this embodiment mode deals with an example in which the projective portions are removed, the projective portions may be left unetched.

Instead of laser light crystallization, the semiconductor film may be crystallized by thermal crystallization which uses an electric heating furnace or by lamp annealing crystallization which uses infrared light. In this case, the semiconductor film is then irradiated with laser light to enhance its crystallinity. Alternatively, the semiconductor film is crystallized by irradiating the film in the film thickness direction with laser light that has an energy low enough to avoid complete melting and then the semiconductor film is irradiated in the film thickness direction with laser light that has an energy high enough to completely melt the semiconductor film.

The descriptions given next are about the structure of each cell and arrangement of cell columns.

For cells used in the present invention, the important thing is that the channel length direction of every TFT in one cell matches the laser light scanning direction as in an example of the cells shown in FIGS. 6A to 6D.

Figure 7:
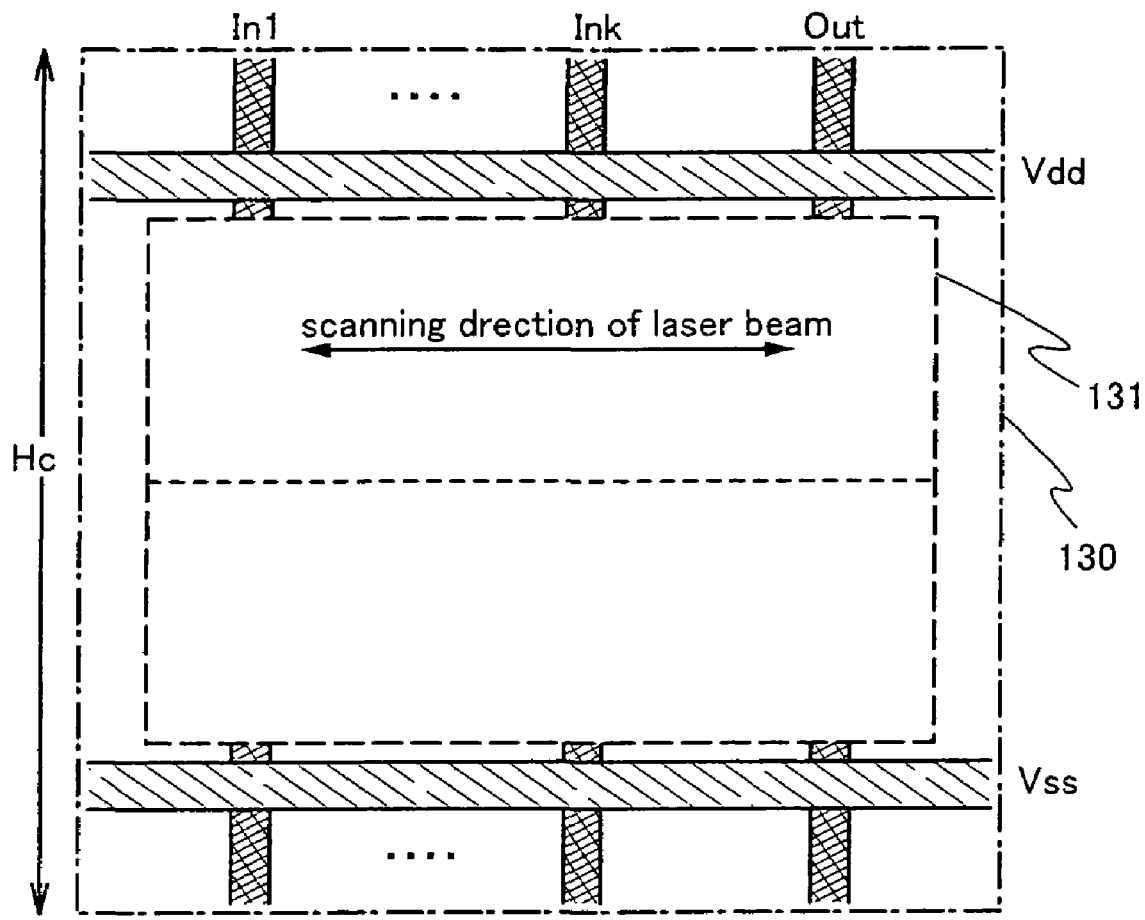
FIG. 7 is a block diagram of a cell used in the present invention.

FIG. 7 is a block diagram of a cell used in the present invention. A cell 130 used in the present invention has a wire to which various signals (In1 to Ink) are inputted and a wire from which a signal (Out) is outputted. The cell 130 further has wires through which the power supply voltages Vdd and Vss are supplied. Although the cell 130 has one wire for output (Out) in FIG. 7, it may have more than one output wires. In the example shown in FIG. 7, the cell 130 has two wires for respectively supplying the power supply voltages Vdd and Vss, but the number of wires for supplying power supply voltages is not limited to two. The number of wires for supplying power supply voltages and the levels of power supply voltages supplied by the wires may differ from one type of cell to another type of cell. However, every cell in the same cell column should have a wire for supplying the same level of power supply voltage.

In a region of the cell 130 that is indicated by a dashed line 131, island-like semiconductor films used to form TFTs and other elements are arranged. When the semiconductor films are later made into TFTs, the channel length direction of every island-like semiconductor film in the same cell has to match the laser light scanning direction.

The width of the cell 130 in the direction perpendicular to the laser light scanning direction and the channel length direction (cell width Hc) is set within the width of the laser light. The cell width Hc in FIG. 7 includes a region where the wires for supplying the power supply voltages Vdd and Vss are placed. However, it is not always necessary in designing to include the region in the cell width Hc. The cell width Hc is a guide for preventing laser light edges from overlapping a portion that later forms an island-like semiconductor film, and it is sufficient if the cell width is defined such that a portion forming an island-like semiconductor film is within a cell.

The cell width is typically about 100 μm, preferably 30 to 200 μm. If minute processing of sub-micron levels becomes available in future, the cell width may be set smaller than this. On the other hand, the cell width can be set larger when the laser light width is large.

Although not shown in FIG. 7, the longitudinal direction of the projective portions of the base film, the laser light scanning direction, and the channel length direction of TFTs in cells matches one another.

Figure 8A:
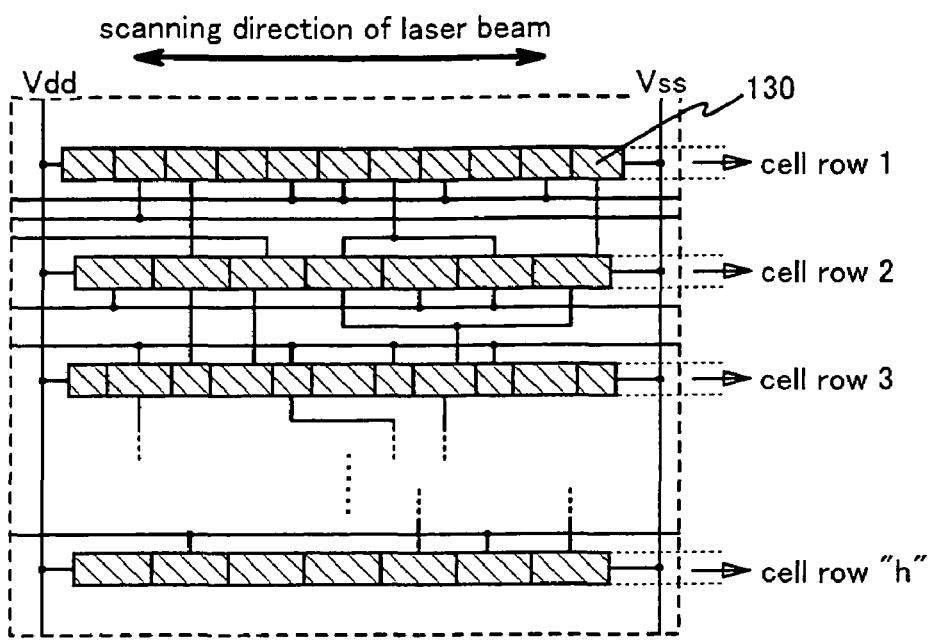
FIGS. 8A and 8B are diagrams showing arrangement of cells in the present invention.

The cells are arranged to form stripe pattern columns along the laser light scanning direction so that the channel length direction in the cells matches the laser light scanning direction. FIG. 8A shows arranging the cells by the cell columns. In FIG. 8A, the cell 130 and cells identical to the cell 130 are placed so as to form columns along the cell column direction. All the cell columns 1 to h in FIG. 8A receive the common power supply voltages Vdd and Vss. However, the present invention is not limited to this structure.

Also, one cell column may have different types of cells. It is sufficient if every cell in the same cell column has a width that does not exceed a certain range, a width that does not exceed the laser light width, to be strict.

Wires for electrically connecting cells are placed between cell columns. Specifically, a wire for signals (In1 to Ink) inputted to cells and a wire for signals (Out) outputted from cells run between cell columns.

Layout of the wires for electrically connecting cells is varied depending on the order of arranging cells in a cell column and the positions of cell columns. These can be set at designer's discretion. It is important to think out through simulation or the like a design that can achieve the best wire layout and the best cell and cell column layout at the same time taking into consideration the wire resistance and the number of layers that constitute a wire.

Figure 8B:
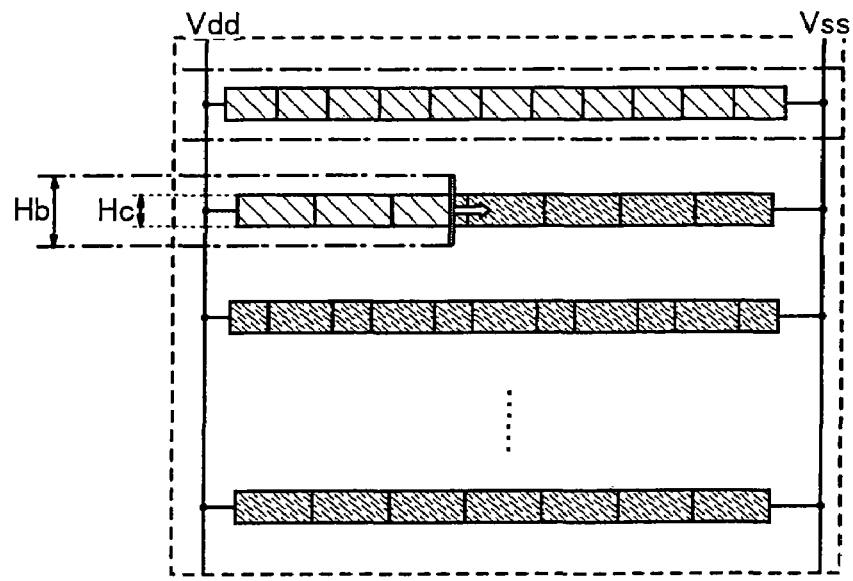

The gap between cell columns has to be decided taking into consideration not only wire layout but also the laser light width. The relation between the cell column gap and the laser light width is described with reference to FIG. 8B. FIG. 8B shows laser light running over a substrate on which plural cell columns are arranged. Actually, the cells are not completed at the time of laser light irradiation and, for conveniences' sake, FIG. 8B shows regions that form cells in a later step.

In running laser light, edges of laser light should not overlap cell columns. Therefore, when the laser light width is given as Hb, the cell width Hc must not exceed the laser light width Hb. Furthermore, a care has to be taken so that a laser light edge does not overlap a cell column while the laser light is running over its adjacent cell column. Accordingly, the width between cell columns has to be designed in accordance with the laser light width Hb to make a laser light edge always fall on a space between cell columns.

Figure 9A:
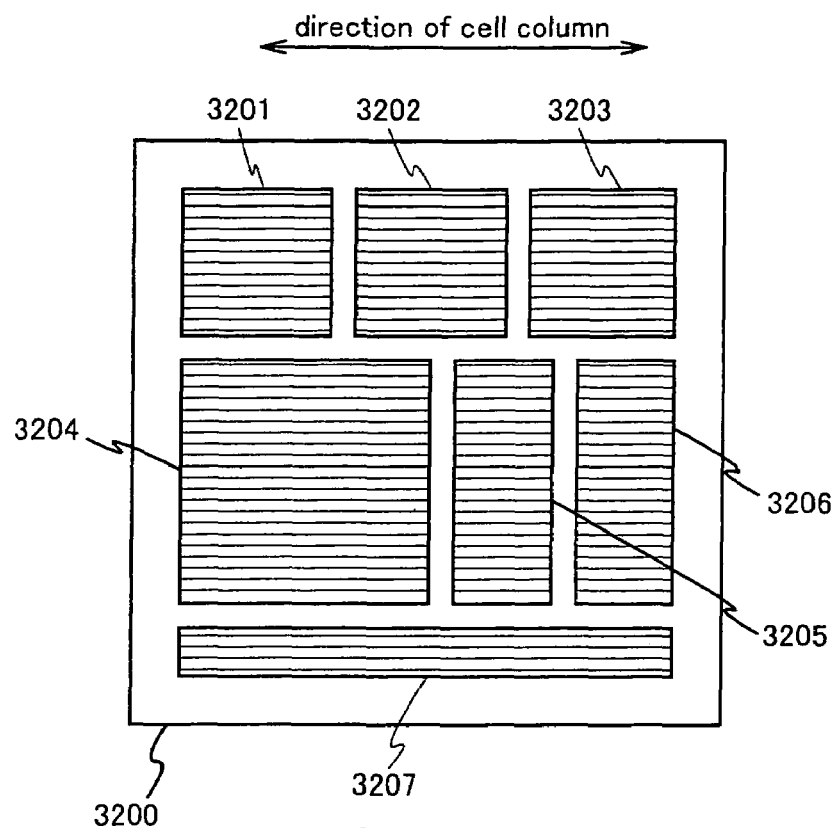
FIGS. 9A and 9B are a diagram showing arrangement of circuits in a microprocessor that is composed of cell columns and a diagram showing a laser light scanning path.

The laser light scanning direction on the entire substrate will be described next. FIG. 9A shows the structure of a microprocessor 3200 that is an example of an integrated circuit manufactured using a designing method or manufacturing method of the present invention. The microprocessor 3200 is composed of various circuits. In FIG. 9A, the microprocessor has a CPU core 3201, a flash memory 3204, a clock controller 3203, a cash memory 3202, a cash controller 3205, a serial interface 3206, an I/O port 3207, etc. The microprocessor shown in FIG. 9A is a simplified example and the circuit design of an actual microprocessor is diversified to suite its use.

In each circuit, a plurality of cell columns are arranged such that all the cell columns have a cell column direction that matches the laser light scanning direction. Each circuit has various kinds of cells and cell columns in one circuit do not always have the same cell width. However, it is necessary to set the cell width equal to or smaller than the laser light width for each cell column in every circuit and to arrange cell columns in each circuit in accordance with the laser light path while preventing laser light edges from overlapping cell columns of each circuit.

Figure 9B:
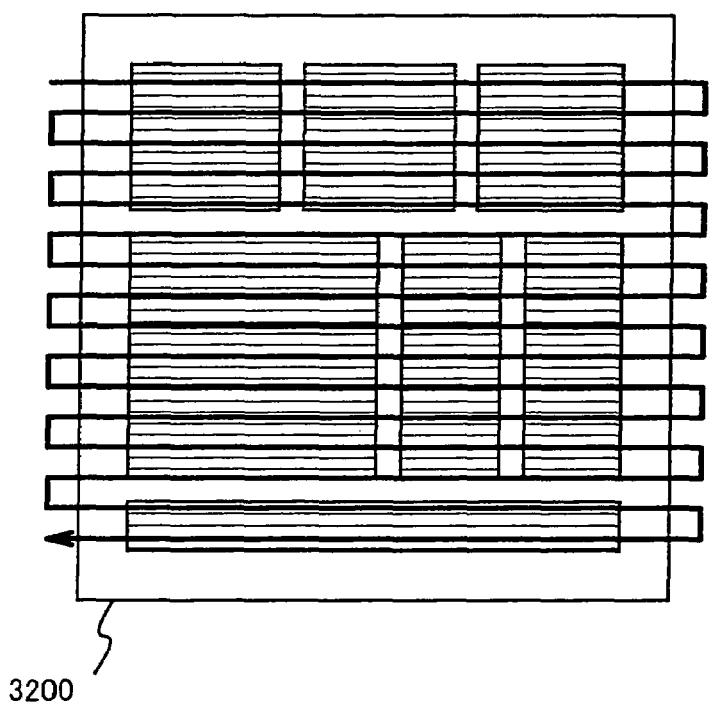

FIG. 9B shows the laser light scanning path on a substrate where the microprocessor 3200 of FIG. 9A is formed. The solid line arrow indicates the laser light scanning path, and cell columns of each circuit are arranged along the path while avoiding overlapping laser light edges.

Although laser light runs over the substrate in one direction in the example shown in FIG. 9B, the present invention is not limited thereto. For instance, the laser light scanning direction may be changed from one circuit on a substrate to another circuit on the substrate. In this case also, the cell column direction has to match the laser light scanning direction in each circuit.

Also, the present invention is not limited to the example shown in FIG. 9A, where cell columns of each circuit are independent of one another. Plural circuits may share one cell column.

As described above, in the present invention, cell layout is decided for each cell type so as to match the channel length direction of each TFT in a cell with the laser light scanning direction and to use a semiconductor film on a depressive portion of a base film as an active layer or a channel formation region, and a desired number of cells from each cell type are arranged to form cell columns along the cell column direction. The gap between cell columns is set in accordance with the laser light width. The above structure makes it possible to reduce layout complexity of a semiconductor device, in particular, an integrated circuit, while abiding by its design restrictions.

A manufacturing method of the present invention can be used to manufacture other devices than a microprocessor, for example, a CPU using an LSI, a memory (e.g., SRAM) for various logic circuits, a counter circuit, a divider circuit, and a driving circuit of a semiconductor display device. The present invention is applicable to various semiconductor devices.

Embodiments of the present invention will be described below.

Embodiment 1

This embodiment gives a description on an example in which every part of an island-like semiconductor film is on a depressive portion.

First, the state of FIGS. 2A and 2B described in Embodiment Mode is obtained.

Next, the entire surface of the semiconductor film 103 is etched to expose the top faces of the projective portions 101a of the base film 101. Through this step, a semiconductor film is obtained which is on depressive portions alone. Any method can be used to remove the semiconductor film 103 from the top faces of the projective portions and, for example, etching or CMP is employed.

The removal from the top faces means removal of portions of the semiconductor film that are on the projective portions 101a and contain grain boundaries. As a result, a semiconductor film of excellent crystallinity is left on a depressive portion between the projective portions 101a to later serve as a channel region.

Figure 10A:
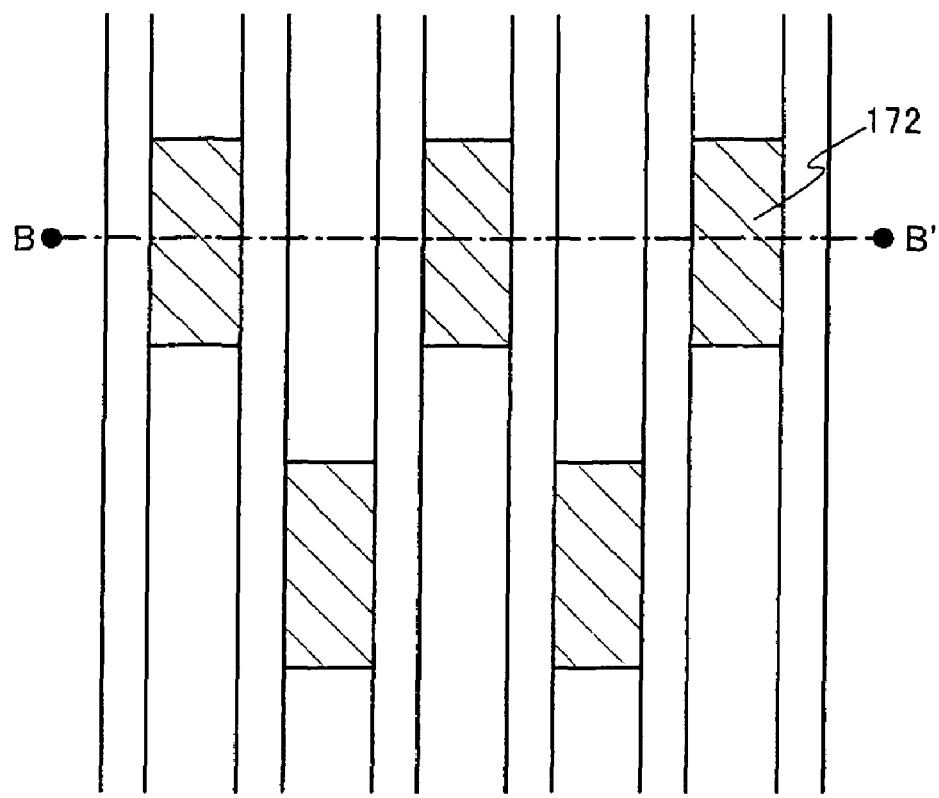
FIGS. 10A and 10B are diagrams showing a process of manufacturing a semiconductor display device of the present invention.
Figure 10B:
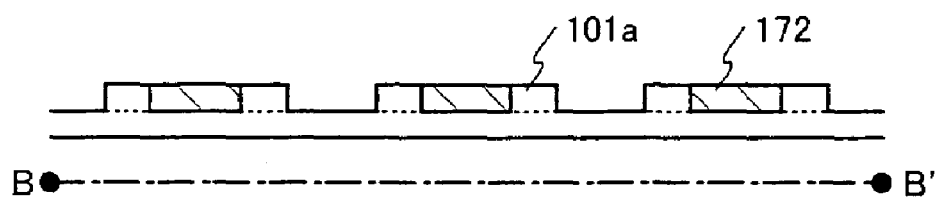

Then the semiconductor film whose surface has been etched is patterned as shown in FIG. 10A to form an island-like semiconductor film 172 which serves as an active layer. FIG. 10B corresponds to a sectional view taken along the dashed line A-A' in FIG. 10A. The island-like semiconductor film 172 is on a depressive portion alone and is partially in contact with the projective portions 101a. Layout of the projective portions 101a should be decided taking into account the channel length and channel width of a TFT. If a source region and a drain region are formed from semiconductor films on depressive portions, the resistance can be lowered in the source region and the drain region.

The island-like semiconductor film 172 is used to manufacture a TFT.

If a mask for forming contact holes in an insulating film formed on an island-like semiconductor film that is formed on a flat base film is not placed correctly, a portion of the base film that is located under the island-like semiconductor film could be etched accidentally to cause discontinuation in an electrode that is in contact with the island-like semiconductor film. In the present invention, the island-like semiconductor film, in particular, portions of the island-like semiconductor film that serve as a source region and a drain region are in contact with the projective portions. Accordingly, the projective portions are partially etched instead of the portion of the base film that is located under the island-like semiconductor film. Discontinuation in a wire that is in contact with the source region or the drain region is thus avoided. This relaxes the design rule in forming the wire and lowers the resistance in the connection portion between the island-like semiconductor film and the wire.

Figure 11A:
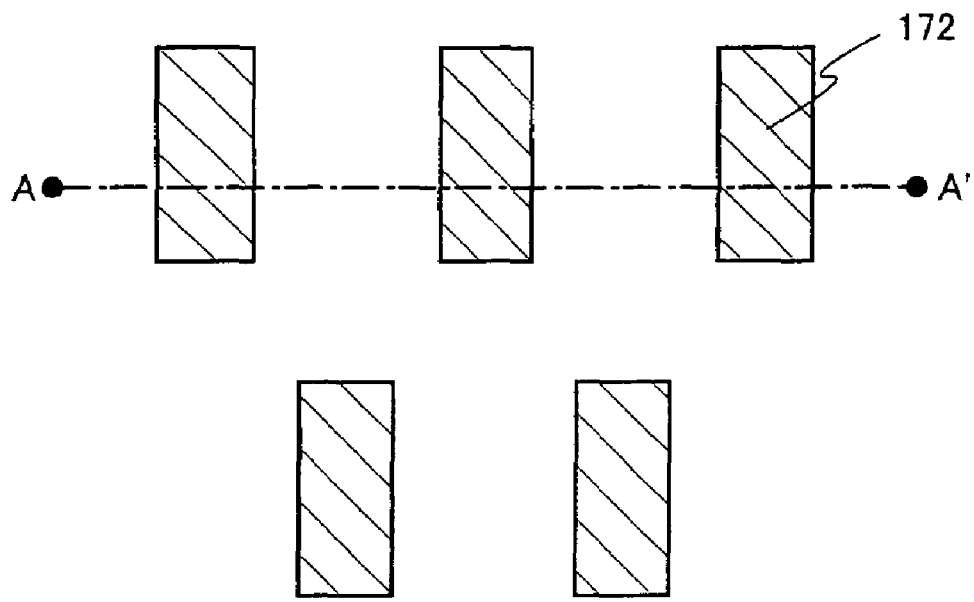
FIGS. 11A and 11B are diagrams showing a process of manufacturing a semiconductor display device of the present invention.
Figure 11B:
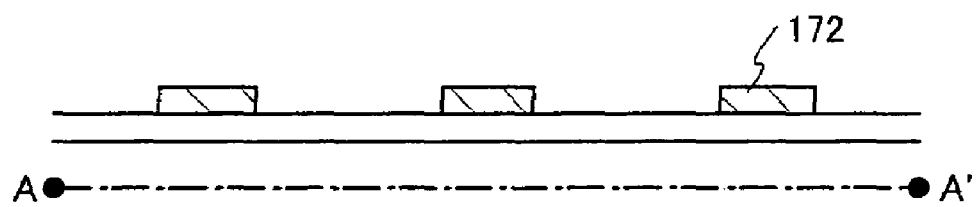

The projective portions 101a may be removed from the state shown in FIGS. 10A and 10B, and the state after the removal is shown in FIG. 11A. FIG. 11B corresponds to a sectional view taken along the dashed line A-A' in FIG. 11A. The removal of the projective portions 101a makes it unnecessary for an insulating film, which is formed later to level the surface, to be thick. In other words, the removal of the projective portions 101a prevents warpage or discontinuation of a wire and pixel electrode which are formed on a planarization insulating film even when the planarization insulating film is not thick enough to completely level the surface irregularities.

Embodiment 2

A method of forming a base film having unevenness is explained in Embodiment 2. Incidentally, the base film described in this embodiment is only one example and the base film used in the present invention is not limited to this structure.

Figure 12A:
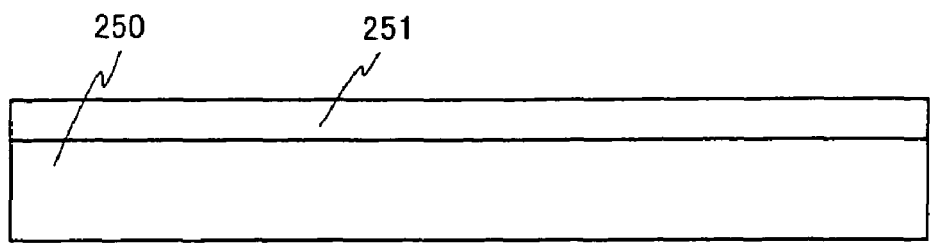
FIGS. 12A to 12D are diagrams showing a process of forming a base film that has projective portions.

A first base film 251 made from an insulating film is first formed on a substrate 250 as shown in FIG. 12A. The first base film 251 uses silicon oxynitride in this embodiment but is not limited to this material, and insulating films having a large selectivity in etching with a second base film may be used. The first base film 251 is formed by a CVD apparatus using $SiH_4$ and $N_2O$ so that its thickness is from 50 to 200 nm. Note that the first base film may be a single layer, and may also be a laminate structure of a plurality of insulating films.

Figure 12B:
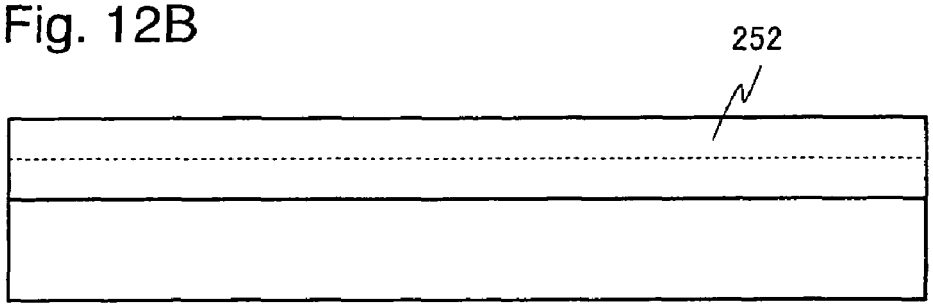

A second base film 252 is formed next from an insulating material that contacts the first base film 251, as shown in FIG. 12B. It is necessary that the film thickness of the second base film 252 be of an order such that unevenness appears in the surface of a semiconductor film formed subsequently when patterning is performed in a later step, forming unevenness. A 30 nm to 300 nm silicon oxide film is formed as the second base film 252 by using plasma CVD in this embodiment.

Figure 12C:
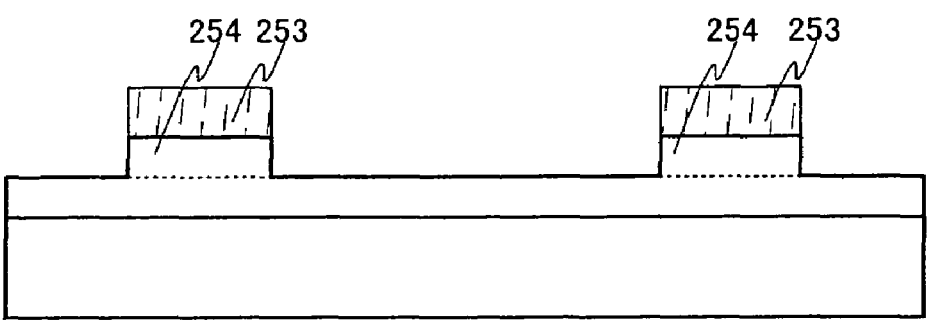
Figure 12D:
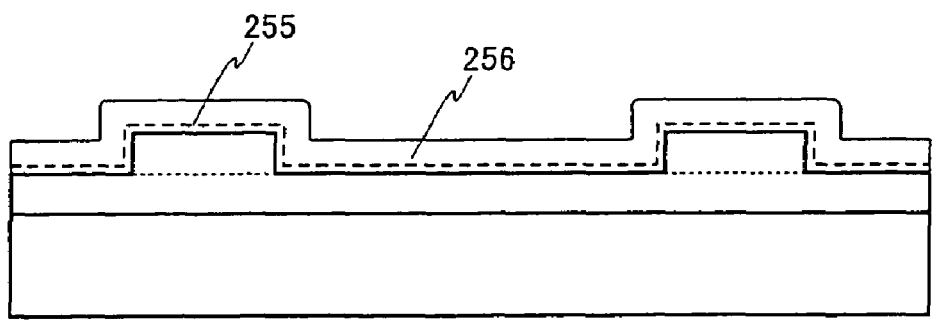

A mask 253 is formed next as shown in FIG. 12C, and the second base film 252 is etched. Note that wet etching is performed at 20° C. in this embodiment, using a mixed solution containing 7.13% ammonium hydrogen fluoride ($NH_4HF_2$) and 15.4% ammonium fluoride ($NH_4F$) (Stella Chemifa Corporation, product name LAL500) as an etchant. Rectangular shape projective portions 254 are formed by this etching. The first base film 251 and the projective portions 254 are taken as one base film in this specification.

Note that it is preferable to pattern the second base film 252 by using RF sputtering in the case where aluminum nitride, aluminum oxynitride, or silicon nitride is used as the first base film 251 and a silicon oxide film is used as the second base film 252. The thermal conductivity of aluminum nitride, aluminum oxynitride, and silicon nitride is high as the first base film 251, and therefore generated heat can quickly diffuse, and TFT deterioration can be prevented.

A semiconductor film is formed next so as to cover the first base film 251 and the projective portions 253. The thickness of the projective portions is from 30 to 300 nm in this embodiment, and therefore it is preferable to set the film thickness of the semiconductor film from 50 to 200 nm, and it is set to 60 nm here. Note that adverse influences are imparted to the semiconductor film crystallinity if impurities mix in between the semiconductor film and the base film. There is a possibility that dispersions in the characteristics of the manufactured TFTs, and that variations in the threshold values may increase, and therefore it is preferable to form the base film and the semiconductor film in succession. A silicon oxide film 255 forms thinly on the base film in Embodiment 2 after forming the first base film 251 and the projective portions 253, and the semiconductor film 256 is then formed without exposure to the outside atmosphere. The thickness of the silicon oxide film can be suitably set by a designer, and is set on the order of 5 nm to 30 nm in Embodiment 2.

Figure 13A:
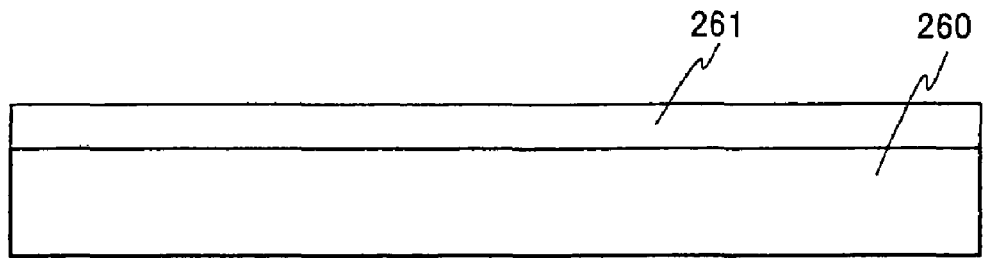
FIGS. 13A to 13C are diagrams showing a process of forming a base film that has projective portions.

A method of forming a base film that differs from that of FIG. 12 is explained next. A first insulating film 261 made from an insulating film is first formed on a substrate 260 as shown in FIG. 13A. The first base film 261 is formed by a silicon oxide film, a silicon nitride film, a silicon oxynitride film, or the like.

If a silicon oxide film is used, it can be formed by plasma CVD by mixing tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm². If a silicon oxynitride film is used, it may be formed by a silicon oxynitride film manufactured by plasma CVD from $SiH_4$, $N_2O$, and $NH_3$, or by a silicon oxynitride film manufactured by plasma CVD from $SiH_4$ and $N_2O$. The manufacturing conditions in this case are that formation can occur at a reaction pressure of 20 to 200 Pa, a substrate temperature of 300 to 400° C., and a high frequency (60 MHz) electric power density of 0.1 to 1.0 W/cm². Further, a hydrogen silicon oxynitride film manufactured from $SiH_4$, $N_2O$, and $H_2$ may also be applied. It is possible to manufacture silicon nitride films similarly by plasma CVD using $SiH_4$ and $NH_3$.

Figure 13B:
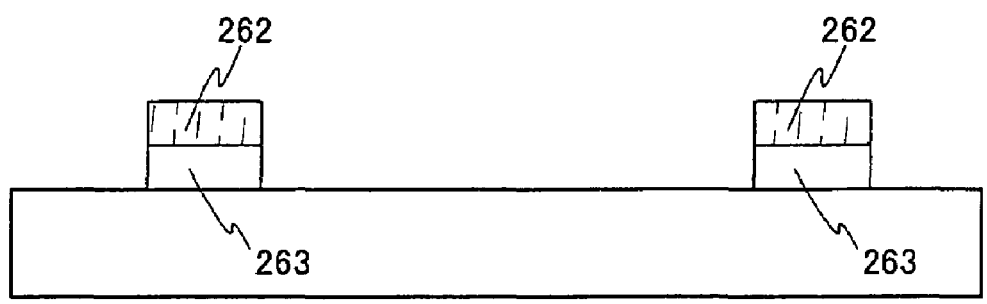
Figure 13C:
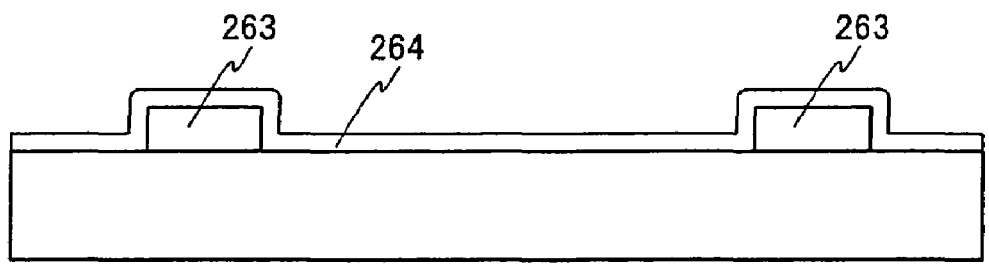

After forming the first base film over the entire substrate to have a thickness of 20 to 200 nm (preferably between 30 and 60 nm), a mask 262 is then formed as shown in FIG. 13B by using a photolithography technique. Unnecessary portions are then removed by etching, thus forming rectangular shape projective portions 263. A dry etching method that uses a fluoride gas with respect to the first base film 261 may be used, and a wet etching method that uses an aqueous solution of a fluoride may be used. In the case where the latter method is selected, etching may be performed by a mixed solution (Stella Chemifa Corporation, product name LAL500) containing 7.13% ammonium hydrogen fluoride ($NH_4HF_2$) and 15.4% ammonium fluoride ($NH_4F$).

A second base film 264 made from an insulating film is formed next so as to cover the projective portions 263 and the substrate 260. This film is formed by using a silicon oxide film, a silicon nitride film, a silicon oxynitride film, or the like at a thickness from 50 to 300 nm (preferably from 100 to 200 nm), similar to the first base film 261.

A base film composed of the projective portions 263 and the second base film 264 is formed in accordance with the above manufacturing processes. Note that impurities can be prevented from mixing in between the semiconductor film and the base film by forming the semiconductor film in succession, without exposure to the atmosphere, after forming the second base film 264.

It is possible to implement Embodiment 2 by being freely combined with Embodiment 1.

Embodiment 3

The TFT formed by using the present manufacturing method can be implemented to a driver circuit of a semiconductor display device and the other circuit included in the semiconductor display device. In this embodiment, a description will be made of a structure of a controller of a semiconductor display device formed according to the manufacturing method of the present invention. Note that in this embodiment, a structure of the controller of a light emitting device using an OLED (organic light emitting device) will be described. However, the present invention is not limited to this but may adopt a controller of the liquid crystal display device and those of other semiconductor display devices. Also, it may be a drive circuit other than the controller and a semiconductor device other than the display device is also possible.

Figure 14:
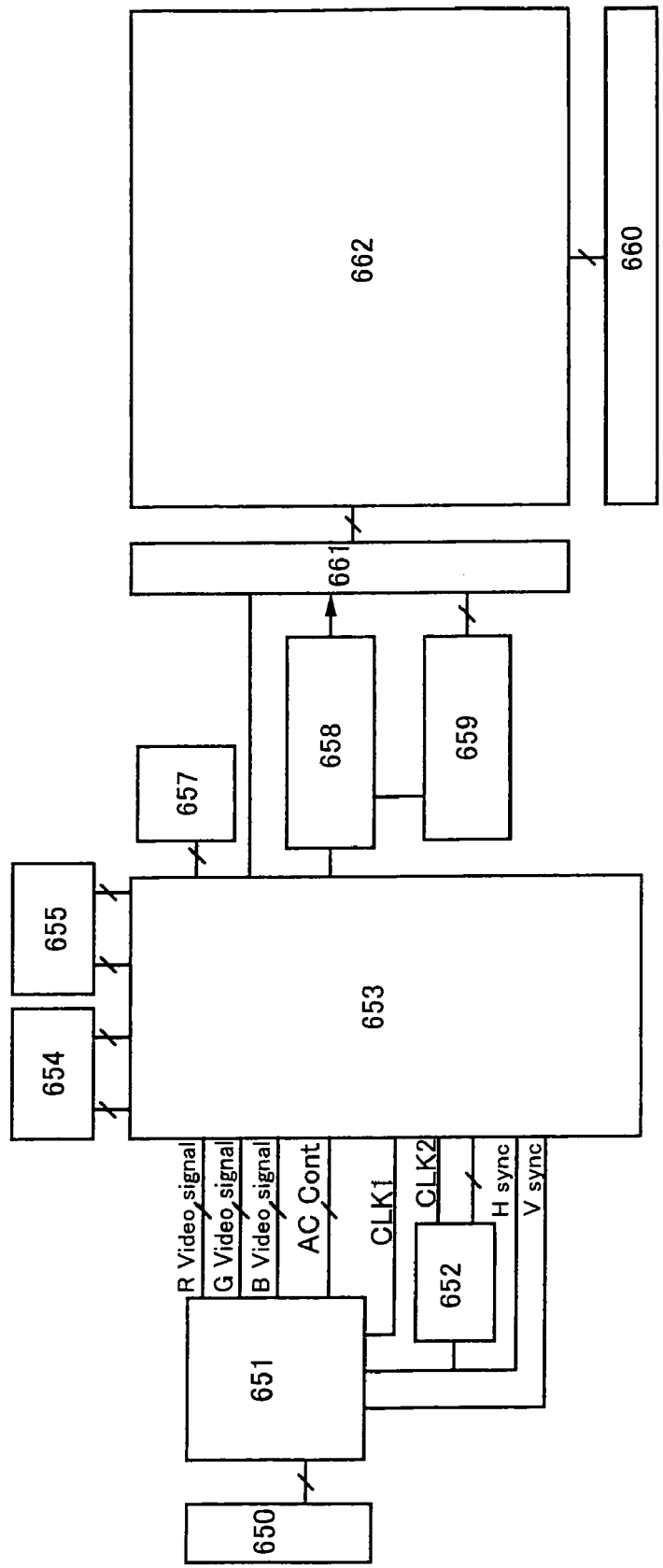
FIG. 14 is a block diagram showing the structure of a controller of a light emitting device which is one of semiconductor devices of the present invention.

FIG. 14 shows the structure of the controller of this embodiment. The controller includes an interface (I/F) 650, a panel link receiver 651, a phase locked loop (PLL) 652, a signal converting portion (FPGA: field programmable logic device) 653, SDRAMs (synchronous dynamic random access memories) 654 and 655, a ROM (read only memory) 657, a voltage adjusting circuit 658, and a power supply 659. Note that in this embodiment, the SDRAM is used, but a DRAM (dynamic random access memory) or an SRAM (static random access memory) can be also used instead of the SDRAM provided that high-speed data writing and reading are possible.

Digital video signals inputted in the semiconductor display device through the interface 650 are subjected to parallel/serial conversion at the panel link receiver 651 into digital video signals corresponding to the respective colors of R, G, and B, which are inputted into the signal converting portion 653.

Also, based on the various signals inputted to the semiconductor display device through the interface 650, an Hsync signal, a Vsync signal, a clock signal CLK, and an alternating voltage are generated at the panel link receiver 651 and inputted to the signal converting portion 653.

The phase locked loop 652 has a function of making in-phase the frequencies of various signals inputted to the semiconductor display device and the operating frequency of the signal converting portion 653. The operating frequency of the signal converting portion 653 does not always conform with the frequencies of the various signals inputted to the semiconductor display device. The phase locked loop 652 adjusts the operating frequency of the signal converting portion 653 in synchronism with the frequencies of the various signals.

The ROM 657 stores a program for controlling the operation of the signal converting portion 653 and the signal converting portion 653 operates according to the program.

The digital video signals inputted to the signal converting portion 653 are temporarily written into the SDRAMs 654 and 655 and held. The signal converting portion 653 reads the digital video signals corresponding to all the pixels on a bit basis among the digital video signals of all bits held in the SDRAM 654. The read signals are inputted to the signal line drive circuit.

The signal converting portion 653 inputs information on the length of the light emission period of the OLED corresponding to each bit into the scanning line drive circuit.

The voltage adjusting circuit 658 adjusts the voltage applied between the anode and the cathode of the OLED of each pixel in synchronism with the signal inputted from the signal converting portion 653. The power supply 659 supplies the voltage at a given level to the voltage adjusting circuit 658, the signal line drive circuit 660, the scanning line drive circuit 661, and the pixel portion 662.

Among the various circuits in the controller, any circuit such as a CPU, a memory, various processors, if obtained by using the TFTs, can be formed according to the manufacturing method of the present invention.

The drive circuit and the controller used in the present invention are not limited to the structures described in this embodiment. This embodiment can be implemented freely in combination with Embodiments 1 and 2.

Embodiment 4

This embodiment describes the flow of a method of designing a semiconductor device of the present invention.

Figure 15:
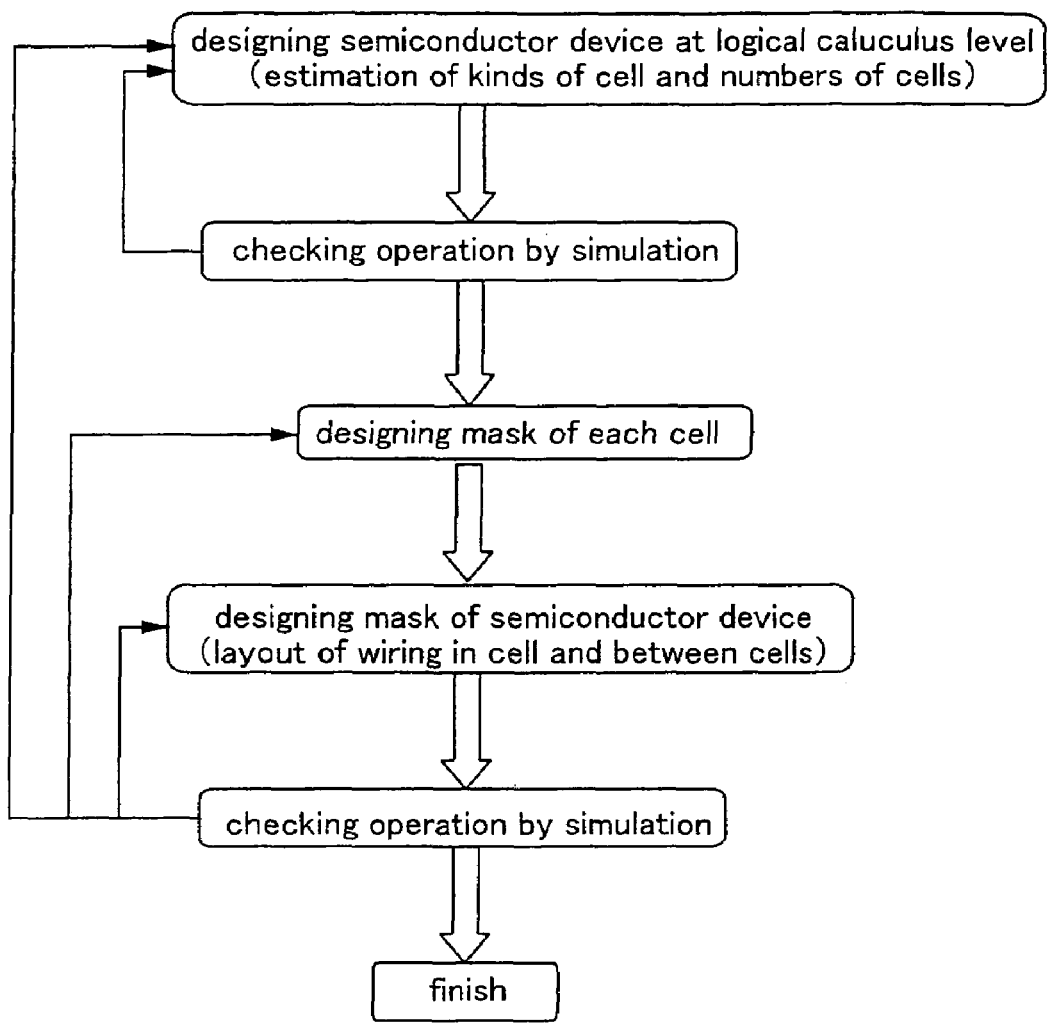
FIG. 15 is a flow chart showing the flow of a method of designing a semiconductor device according to the present invention.

FIG. 15 is a flow chart showing the flow of a method of designing a semiconductor device. As shown in FIG. 15, the first step is to design an objective semiconductor device at logical calculus level. At this point, various kinds of logic elements (cells) used in the objective semiconductor device, numbers of the cells, and connection relation between the cells are grasped.

Simulation at logical calculus level may be put in here to check whether the circuits can carry out objective operations. If it turns out that the objective operations are not obtained, start over designing at logical calculus level.

Next, a mask for each cell is designed. A cell can be any element as long as it outputs a certain value under a certain input condition.

The important thing in designing a mask for a cell is that the channel length direction of every TFT is matched with the laser light scanning direction and that the cell width does not exceed the laser light width.

After a mask is designed for each cell, layout of the semiconductor device is decided combining various types of cells in desired numbers. The cells are arranged so as to form columns along the laser light scanning direction. The cell column direction must always match the channel length direction in each cell. Then the gap between cell columns is determined taking the laser light width into account and preventing laser light edges from overlapping the cell columns.

Layout of wires for connecting cells with one another is also determined. Wire layout is varied depending on the order of arranging cells in a cell column and the positions of cell columns. These can be set at designer's discretion. It is important to think out through simulation or the like a design that can achieve the best wire layout and the best cell and cell column layout at the same time taking into consideration the wire resistance and the number of layers that constitute a wire.

After semiconductor layout is decided, another simulation is conducted to check the operations. If it turns out that the objective operations are not obtained, a mask for each cell, arrangement of cells, and layout of wires between cells are redesigned. If necessary, it is possible to go back to the logical calculus level to start over designing.

If the operations are confirmed through the above operation, designing is completed. A designing method of the present invention makes it possible to reduce design complexity while abiding by design restrictions which accompany a manufacturing method of the present invention.

This embodiment can be combined freely with Embodiments 1 though 3.

Embodiment 5

This embodiment gives a description on structures of various cells used in a designing method of the present invention.

Figure 16A:
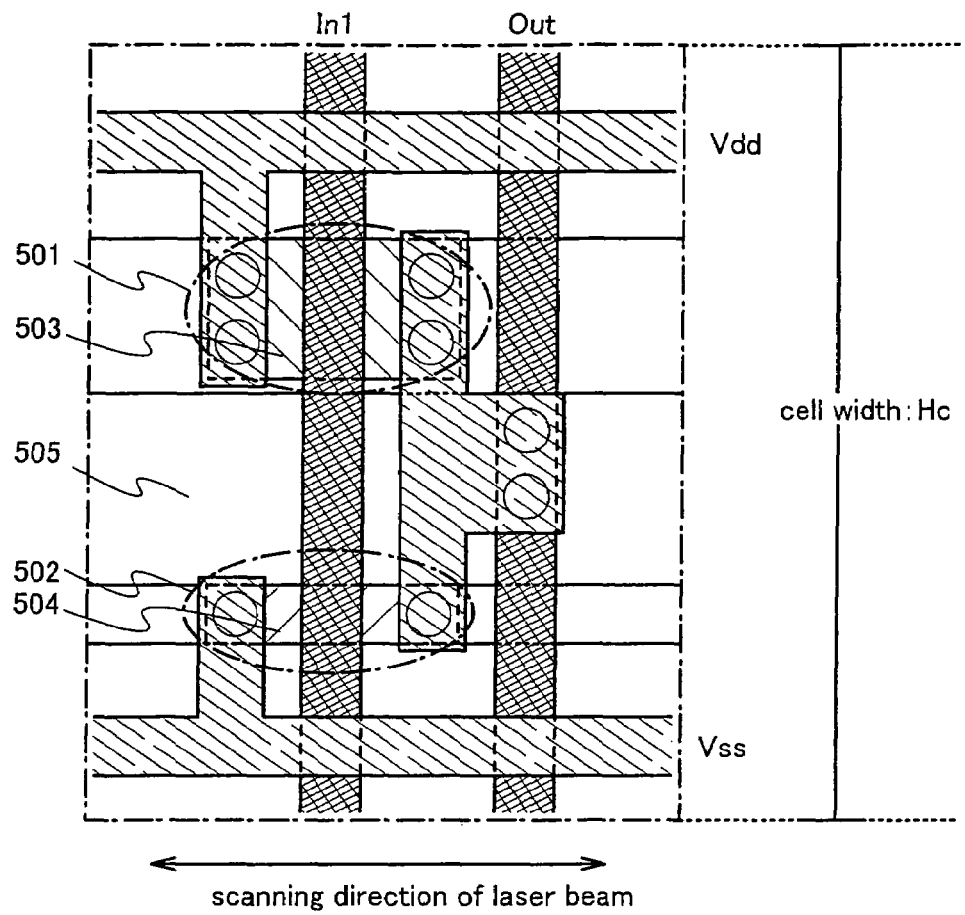
FIGS. 16A and 16B are diagrams showing the structure of an inverter cell used in the present invention.
Figure 16B:
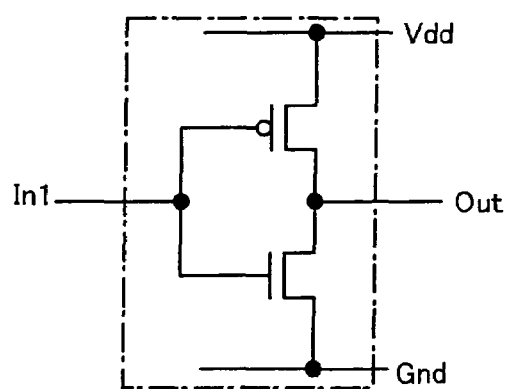

FIGS. 16A and 16B show an inverter cell structure which is different from the inverter cell structure shown in FIGS. 6A to 6D. FIG. 16A is a top view of an inverter cell of this embodiment, and FIG. 16B is an equivalent circuit diagram thereof. Denoted by 501 is a p-channel TFT and 502 is an n-channel TFT. The p-channel TFT 501 and the n-channel TFT 502 have island-like semiconductor films 503 and 504, respectively. The channel length direction of the island-like semiconductor films matches the laser light scanning direction.

The cell shown in FIG. 16A and other cells in the same cell column share wires supplying the power supply voltages Vdd and Vss. The cell width Hc is smaller than the laser light width.

Unlike the inverter shown in FIG. 6A, the island-like semiconductor films 503 and 504 of the inverter in FIG. 16A are placed solely between projective portions 505. In FIG. 16A, the p-channel TFT 501 and the n-channel TFT 502 have different channel widths in order to balance ON current and the depressive portion width is changed accordingly.

Although every part of an active layer of a TFT is on a depressive portion in the example shown in FIG. 16A, the present invention is not limited thereto. A multi-channel TFT may be used and the projective portions may be removed.

Figure 17A:
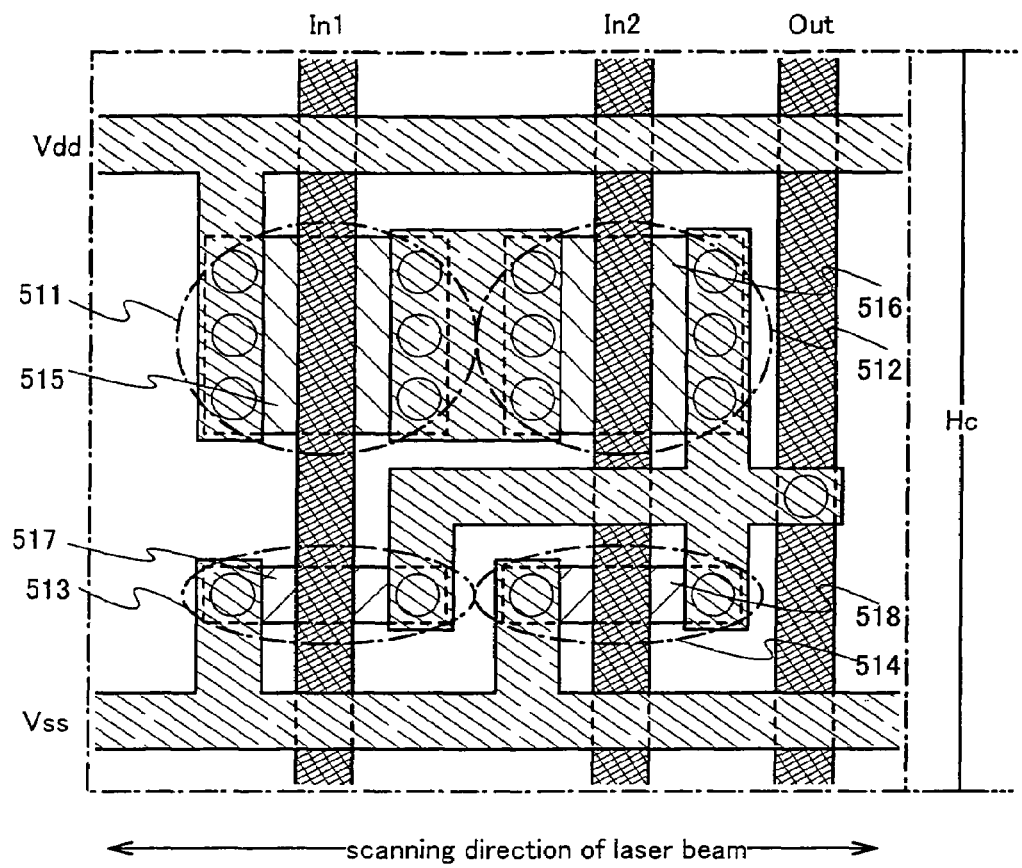
FIGS. 17A and 17B are diagrams showing the structure of a two-input NOR cell used in the present invention.
Figure 17B:
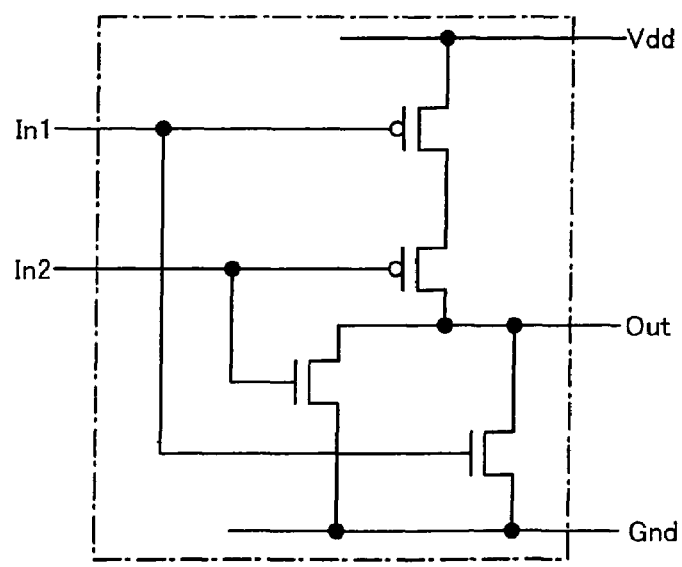

The structure of a two-input NOR cell is described next. FIG. 17A is a top view of a two-input NOR cell. FIG. 17B is an equivalent circuit diagram of the two-input NOR cell shown in FIG. 17A.

In FIG. 17A, two p-channel TFTs 511 and 512 and two n-channel TFTs 513 and 514 are formed. The TFTs 511 to 514 have island-like semiconductor films 515 to 518, respectively. The channel length direction of the island-like semiconductor films matches the laser light scanning direction.

The cell shown in FIG. 17A and other cells in the same cell column share wires supplying the power supply voltages Vdd and Vss. The cell width Hc is smaller than the laser light width.

The projective portions are removed in the example shown in FIG. 17A. However, the present invention is not limited thereto. A multi-channel TFT may be used and the projective portions may be left.

Cells of the present invention are not limited to an inverter and a two-input NOR but can be various logic elements.

This embodiment can be combined freely with Embodiments 1 though 4.

Embodiment 6

The semiconductor device equipped with the TFT formed by the present invention can be applied to various electronic apparatuses. Examples of the electronic apparatuses are portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 18A to 18H.

Figure 18A:
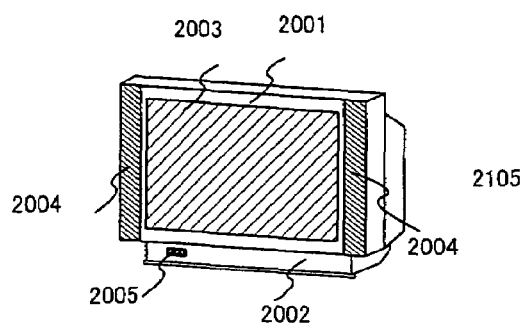
FIGS. 18A to 18H are diagrams of electronic equipment that uses a semiconductor display device of the present invention.

FIG. 18A shows a display apparatus, which is composed of a case 2001, a support base 2002, a display unit 2003, speaker units 2004, a video input terminal 2005, etc. The display apparatus of the present invention can be completed by using various logic circuits such as a driver circuit of the display device, a CPU, and an image processing circuit manufactured by the present invention to the display unit 2003 and other signal processing circuits. The display device refers to all display devices for displaying information, including ones for personal computers, for TV broadcasting reception, and for advertisement.

Figure 18B:
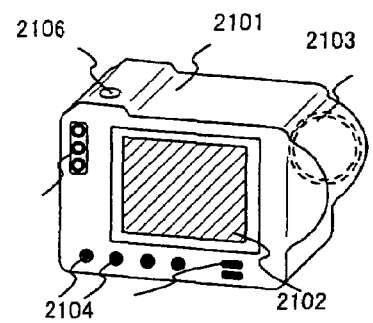

FIG. 18B shows a digital still camera, which is composed of a main body 2101, a display unit 2102, an image receiving unit 2103, operation keys 2104, an external connection port 2105, a shutter 2106, etc. The digital still camera of the present invention can be completed by using various logic circuits such as a driver circuit of the display device, a CPU, and an image processing circuit manufactured by the present invention to the display unit 2102 and other signal processing circuits.

Figure 18C:
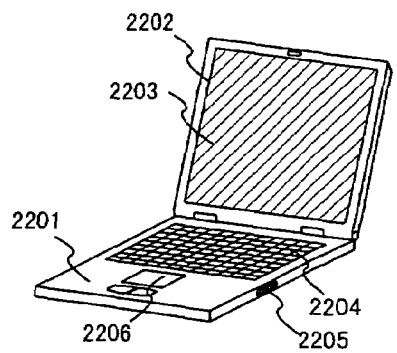

FIG. 18C shows a notebook personal computer, which is composed of a main body 2201, a case 2202, a display unit 2203, a keyboard 2204, an external connection port 2205, a pointing mouse 2206, etc. The notebook personal computer of the present invention can be completed by using various logic circuits such as a driver circuit of the display device, a CPU, and an image processing circuit manufactured by the present invention to the display unit 2203 and other signal processing circuits.

Figure 18D:
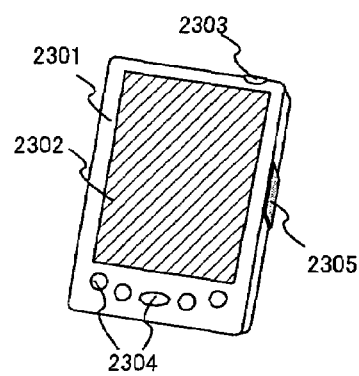

FIG. 18D shows a mobile computer, which is composed of a main body 2301, a display unit 2302, a switch 2303, operation keys 2304, an infrared port 2305, etc. The mobile computer of the present invention can be completed by using various logic circuits such as a driver circuit of the display device, a CPU, and an image processing circuit manufactured by the present invention to the display unit 2302 and other signal processing circuits.

Figure 18E:
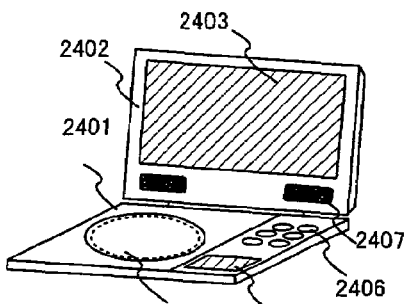

FIG. 18E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. Note that the image reproducing device equipped with a recording medium includes a domestic game machine. The image reproducing device of the present invention can be completed by using various logic circuits such as a driver circuit of the display device, a CPU, and an image processing circuit manufactured by the present invention to the display unit A 2403, the display unit B 2404 and other signal processing circuits.

Figure 18F:
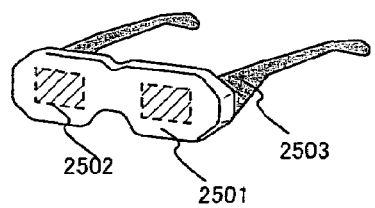

FIG. 18F shows a goggle type display (head mounted display), which is composed of a main body 2501, display units 2502, and arm units 2503. The goggle type display of the present invention can be completed by using various logic circuits such as a driver circuit of the display device, a CPU, and an image processing circuit manufactured by the present invention to the display unit 2502 and other signal processing circuits.

Figure 18G:
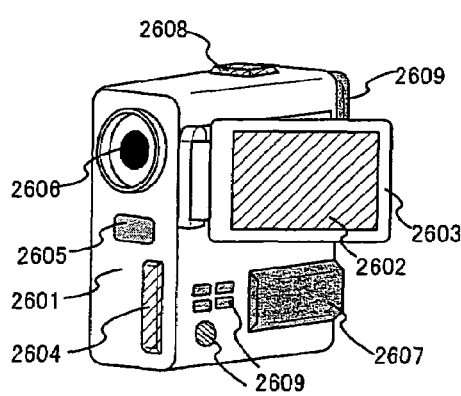

FIG. 18G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, an eye piece unit 2610 etc. The video camera of the present invention can be completed by using various logic circuits such as a driver circuit of the display device, a CPU, and an image processing circuit manufactured by the present invention to the display unit 2602 and other signal processing circuits.

Figure 18H:
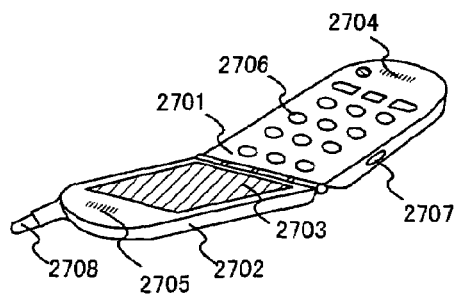
Figure 19:
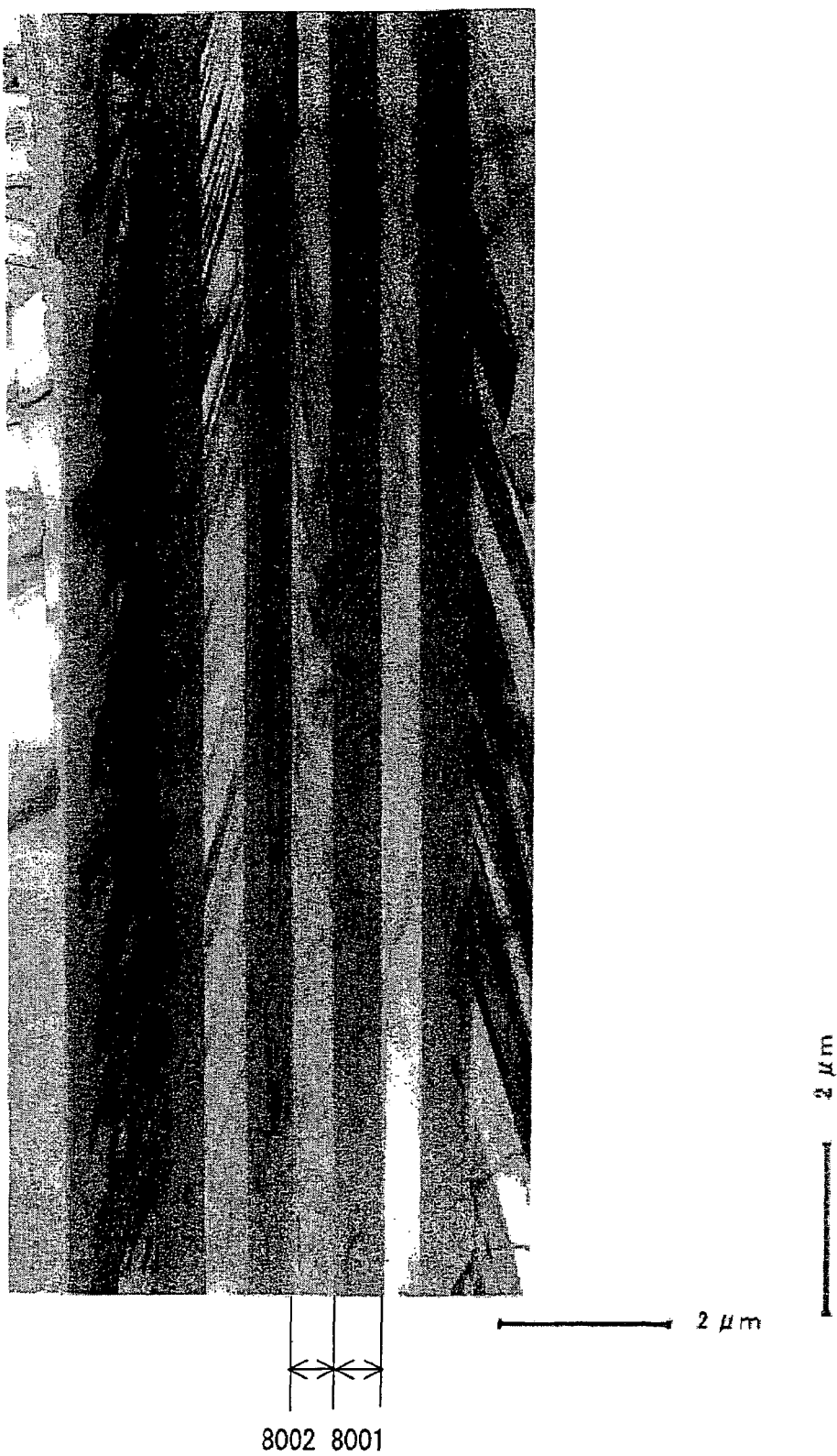
FIG. 19 is a TEM image viewed from above after a semiconductor film formed on a base film that has projective portions is crystallized by laser light irradiation and subjected.
Figure 20:
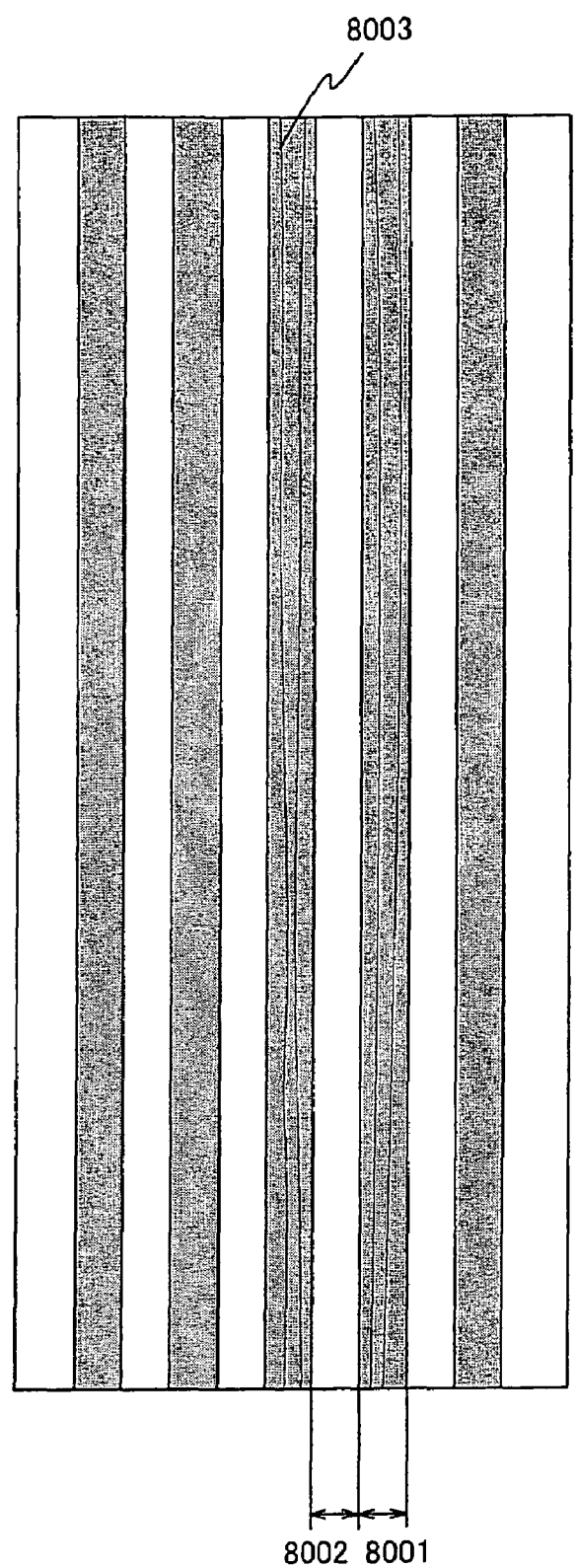
FIG. 20 is a schematic diagram of the TEM image of FIG. 19.
Figure 21:
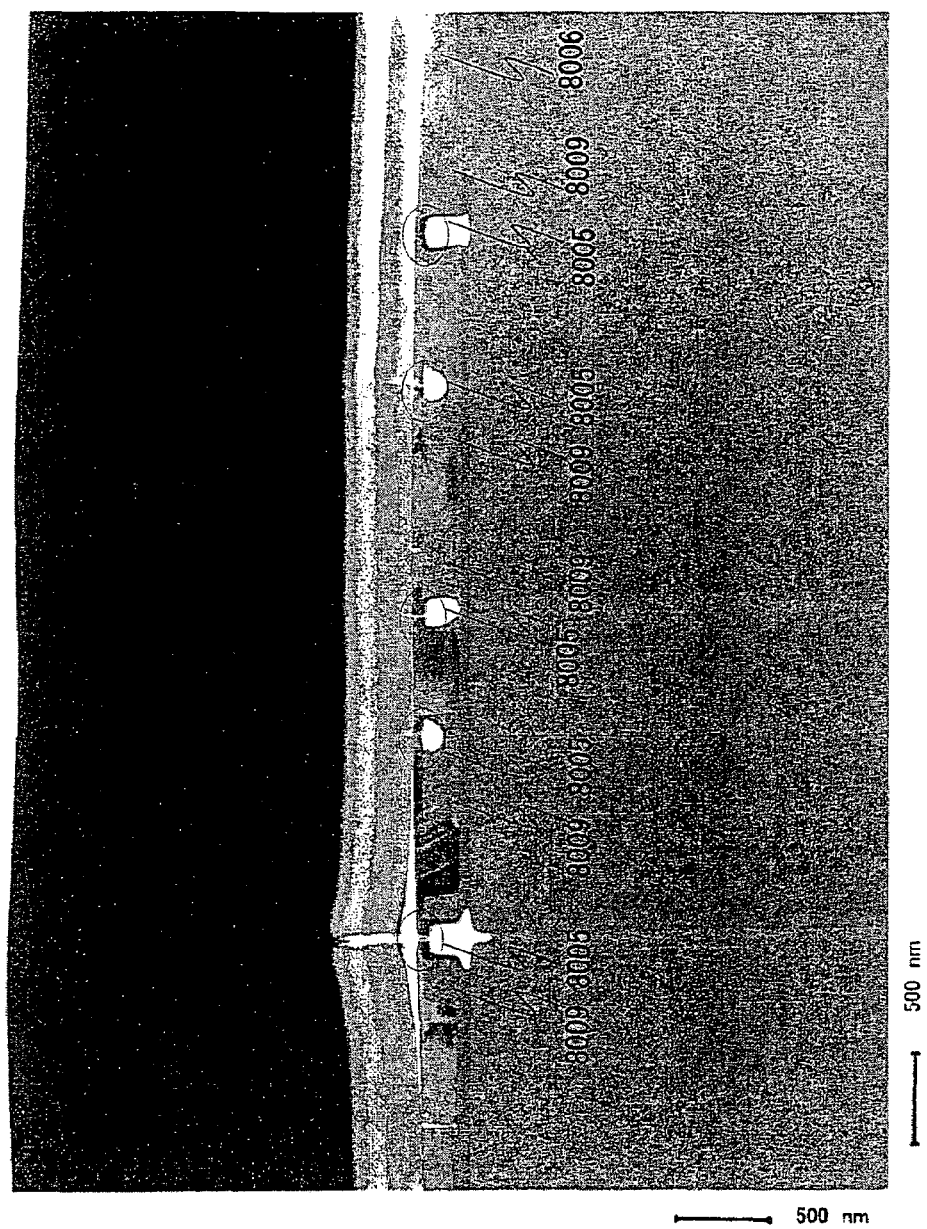
FIG. 21 is a TEM image in section after a semiconductor film formed on a base film that has projective portions is crystallized by laser light irradiation and subjected to Secco etching.
Figure 22:
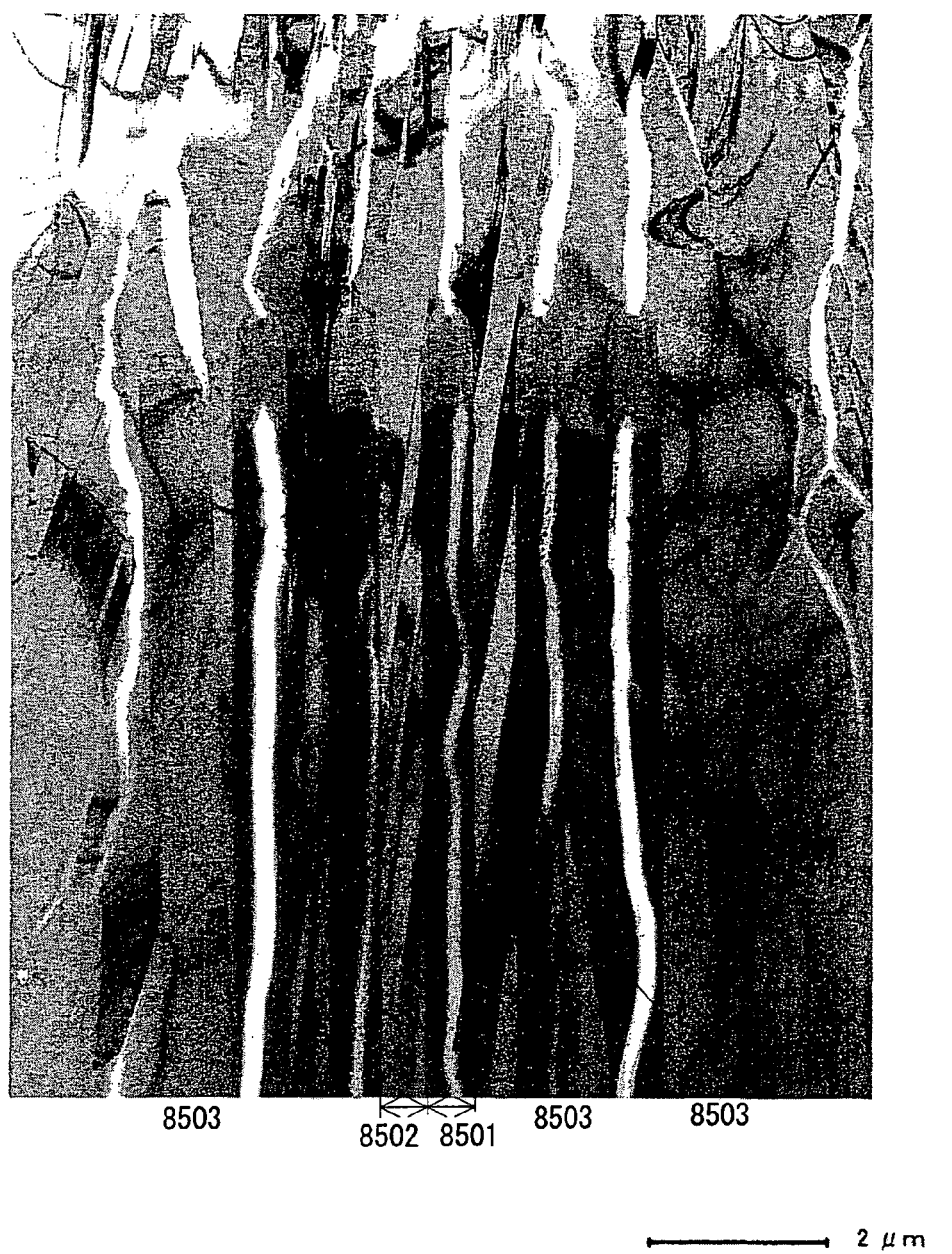
FIG. 22 is a TEM image viewed from above after a semiconductor film formed on a base film that has projective portions is crystallized by laser light irradiation and subjected to Secco etching.
Figure 23A:
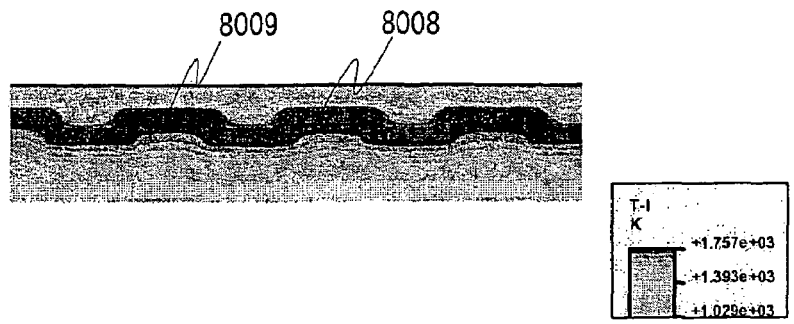
FIGS. 23A to 23F are diagrams showing a change with time in temperature distribution when a silicon film formed on a base film that has concave and convex is crystallized by laser light irradiation.
Figure 23B:
Figure 23C:
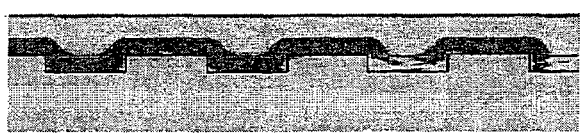
Figure 23D:
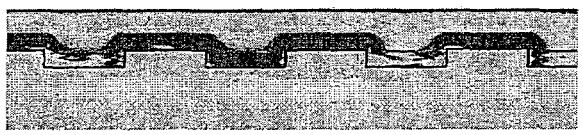
Figure 23E:
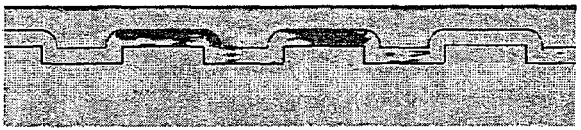
Figure 23F:
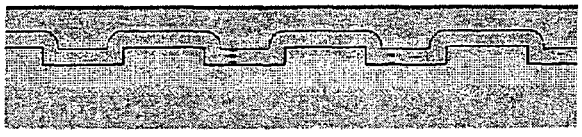
Figure 24:
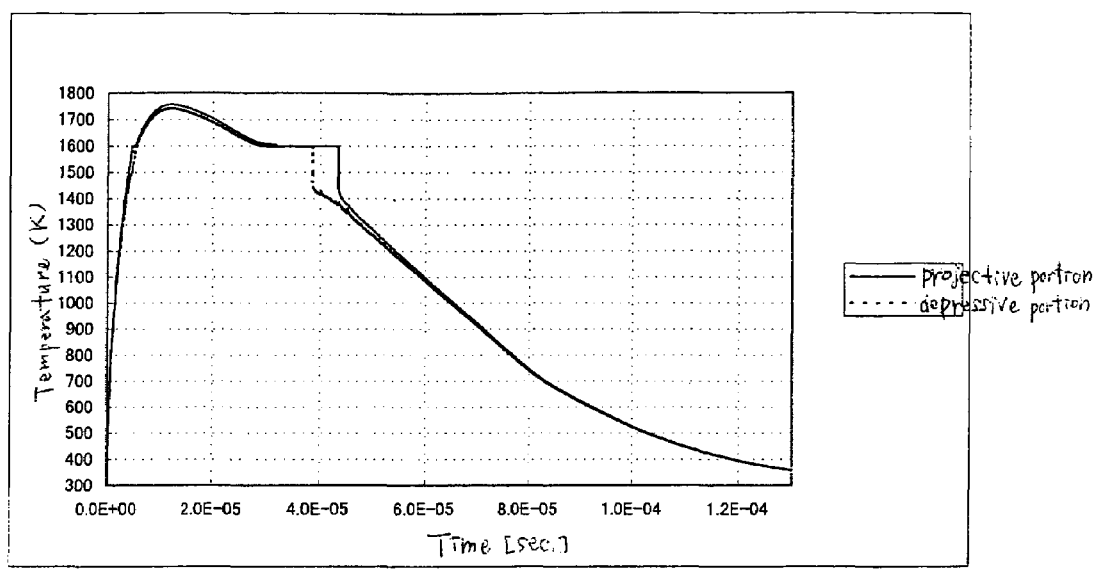
FIG. 24 is a graph showing a change with time in temperature when a silicon film formed on a base film that has concave and convex is crystallized by laser light irradiation.

FIG. 18H shows a cellular phone, which is composed of a main body 2701, a case 2702, a display unit 2703, an audio input unit 2704, an audio output unit 2705, operation keys 2706, an external connection port 2707, an antenna 2708, etc. If the display unit 2703 displays white letters on black background, the cellular phone consumes less power. The cellular phone of the present invention can be completed by using various logic circuits such as a driver circuit of the display device, a CPU, and an image processing circuit manufactured by the present invention to the display unit 2703 and other signal processing circuits.

As described above, the application range of the present invention is so wide that it is applicable to electric apparatuses of any field. This embodiment can be implemented by combining with any structure of Embodiments 1 to 5.

Embodiment 7

This embodiment describes a mask drawing for a semiconductor device manufactured from cells.

Figure 25A:
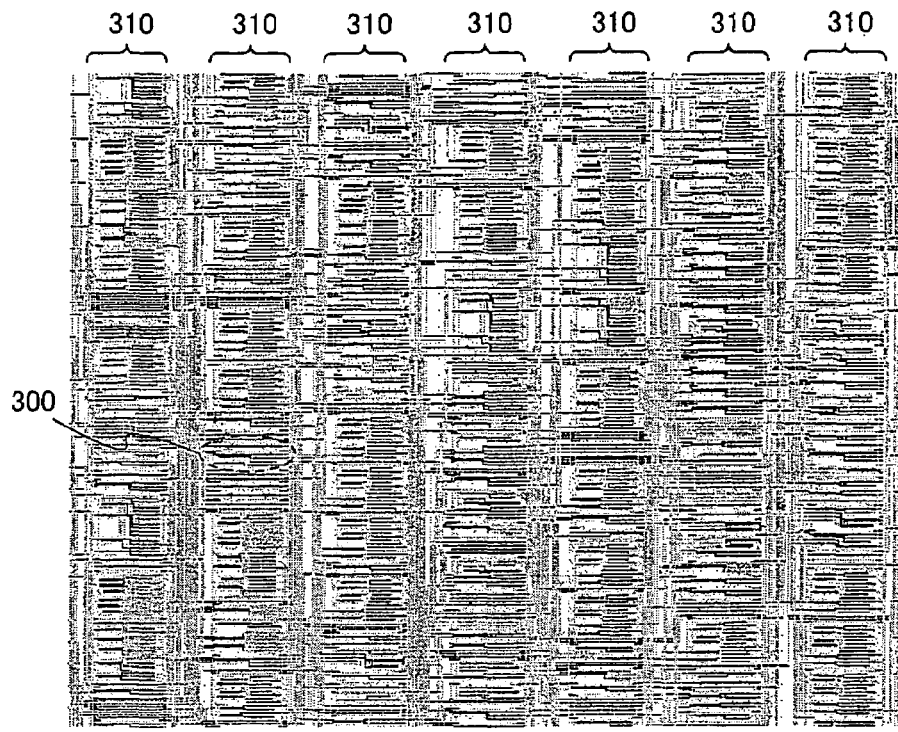
FIGS. 25A to 25C are diagrams of a mask of a cell.
Figure 25B:
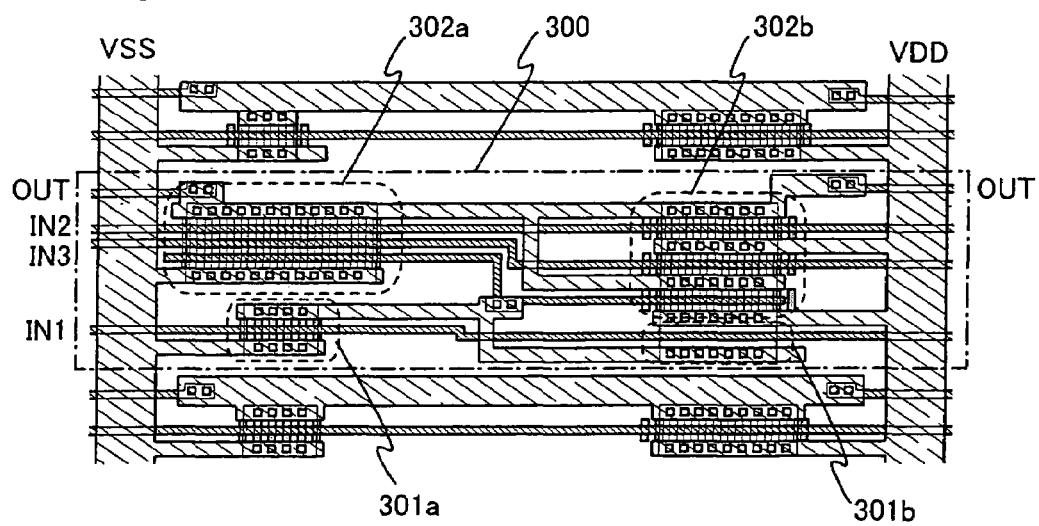
Figure 25C:
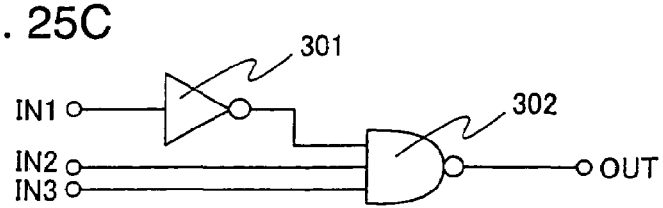

FIG. 25A is a mask drawing for arrays of a large number of cells. In the present invention, a mask drawing is divided into cell columns 310 in which cells are lined up and regions in which wires for electrically connecting cells with one another are placed. An enlarged view of a cell 300 in a region circled by the dashed line in FIG. 25A is shown in FIG. 25B. FIG. 25C is an equivalent circuit diagram of the cell 300 shown in FIG. 25B.

The cell 300 has one inverter 301 and NAND 302. The NAND 302 has three inputs (IN1, IN2, and IN3) and one output (OUT). The IN1 alone is inverted by the inverter 301.

Denoted by 302a are three n-channel TFTs of the NAND 302, and 302b are three p-channel TFTs of the NAND 302. 301a is an n-channel TFT of the inverter 301, and 301b is a p-channel TFT of the inverter 301.

Embodiment 8

This embodiment describes with reference to FIGS. 26A to 26E a manufacturing method in which a TFT formed utilizing a base film that has concave and convex is transferred onto a plastic substrate along with the base film. The description in this embodiment takes a TFT as an example of a semiconductor element. However, semiconductor-elements included in a semiconductor device are not limited to TFTs and various circuit elements are used. Typically, a semiconductor device includes, other than TFTs, a storing element, a diode, a photoelectric conversion element, a resistor element, a coil, a capacitor element, an inductor, etc.

The first step is to prepare a first substrate 701 having a heat resistance that can withstand heat treatment in a process of manufacturing a TFT 705. A metal film 702 is formed on the first substrate 701 and the surface of the metal film 702 is oxidized to form a very thin metal oxide film 703 on the order of several nm. Here, the metal film 702 is a tungsten film and has a thickness of 10 to 200 nm, preferably 50 to 75 nm.

Next, a base film 704 having concave and convex and a semiconductor film are formed on the metal oxide film 703 in order to form a laminate. The base film 704 may be a single layer or a laminate of two or more layers.

The semiconductor film is then crystallized by laser light and patterned to form an island-like semiconductor film. At this point, only a portion that serves as a channel formation region may be etched in the surface or the projective portions of the base film 704 may be removed by etching after the crystallization.

Then the TFT 705 is manufactured from the island-like semiconductor film. FIG. 26A is a sectional view including a channel formation region 706 of the TFT 705 in the direction perpendicular to the channel length direction. The channel formation region 706 of the TFT 705 is between the projective portions of the base film 704. The TFT 705 is covered with an interlayer insulating film 708.

The interlayer insulating film 708 is covered with a protective layer 707. The protective layer 707 has a function of protecting the surface of the TFT 705 when a second substrate is later bonded and then peeled. A material that can be removed after the second substrate is peeled off is used for the protective layer 707. For instance, epoxy-based, acrylate-based, or silicone-based resin soluble in water or alcohols is applied to the entire surface and baked to form the protective layer 707 (FIG. 26A).

Next, the metal oxide film 703 is crystallized in order to facilitate the later peeling. Through the crystallization, the metal oxide film 703 becomes easy to crack at grain boundaries and its fragility is increased. In this embodiment, the metal oxide film is crystallized by heat treatment at 420 to 550° C. for 0.5 to 5 hours. The heat treatment for crystallizing the metal oxide film may be put before bonding of a third substrate or before bonding of the second substrate. Alternatively, heat treatment for forming the semiconductor element may double as the crystallization of the metal oxide film.

The next step is treatment for forming a portion that serves as a starting point of the peeling by partially lowering adhesion between the metal oxide film 703 and the base film 704 or adhesion between the metal oxide film 703 and the metal film 702. Specifically, a localized pressure is applied from the external along the perimeter of the region to be peeled to damage a portion in the layer of the metal oxide film 703 or near the interface of the metal oxide film 703. A lowered-adhesion portion as a starting point of peeling is thus formed prior to peeling. In this way, defects in the later peeling step are reduced and the yield is improved.

Next, a second substrate 710 is attached to the protective layer 707 using a piece of double-sided tape 709 and then a third substrate 712 is attached to the first substrate 701 using a piece of double-sided tape 711 (FIG. 26B). An adhesive may be used instead of double-sided tape. For example, if an adhesive that is peeled by ultraviolet rays is used, the load on the semiconductor element when the second substrate is peeled can be lessened. With the third substrate 712 attached, damage to the first substrate 701 is avoided in the later peeling step. Substrates having higher rigidity than the first substrate 701, for example, quartz substrates or semiconductor substrates, are preferred for the second substrate 710 and the third substrate 712.

Then the metal film 702 and the base film 704 are physically peeled off (FIG. 26C). The region where adhesion of the metal oxide film 703 to the metal film 702 or the base film 704 is partially lowered in the previous step is the first to be peeled. Through the peeling, some portions are separated between the metal film 702 and the metal oxide film 703, other portions are separated between the base film 704 and the metal oxide film 703, and the metal oxide film 703 in still other portions are divided into two. After the separation, the TFT 705 remains attached to the second substrate 710 side whereas the first substrate 701 and the metal film 702 remain attached to the third substrate 712 side. The peeling can be achieved with a relatively small force (for example, by hands, pressure of gas blown from a nozzle, or ultrasonic).

Next, an adhesive 713 is used to bond a plastic substrate 714 to the base film 704 to which the metal oxide film 703 is partially adhered (FIG. 26D). When bonding the plastic substrate, it is important to choose as the adhesive 713 a material that can provide stronger adhesion between the base film 704 and the plastic substrate 714 than the adhesion of the double-sided tape 709 between the second substrate 710 and the protective layer 707.

If the metal oxide film 703 is left on the surface of the base film 704, it may weaken adhesion of the base film to the plastic substrate 714. Therefore, in order to enhance the adhesion, the remaining metal oxide film may be removed completely by etching or the like before the plastic substrate is bonded.

The adhesive 713 is chosen from various curable adhesives including a reaction curable adhesive, a thermally curable adhesive, a photo curable adhesive (e.g., UV curable adhesive), and an anaerobic adhesive. Desirably, the adhesive 713 is given high heat conductivity by mixing powder of silver, nickel, aluminum, or aluminum nitride or filler.

Next, as shown in FIG. 26D, the double-sided tape 709 and the second substrate 710 are peeled off of the protective layer 707 in order or at the same time. If a UV curable adhesive is used as the adhesive 713 and tape or adhesive that is peeled by ultraviolet rays is used for the double-sided tape 709, peeling of the double-sided tape 709 and curing of the adhesive 713 are achieved simultaneously by UV irradiation.

Then the protective layer 707 is removed as shown in FIG. 26E. The protective layer 707 here is water-soluble resin and therefore is removed by dissolving it in water. Defects due to the residual protective layer 707 can be avoided by subjecting the surface after the removal to washing or $O_2$ plasma treatment to remove a part of the residual protective layer 707.

The metal film 702 in this embodiment is formed of tungsten but the material of the metal film in the present invention is not limited thereto. Any material containing a metal can be used as long as the metal oxide film 703 is formed on its surface and the substrate can be peeled by crystallizing the metal oxide film 703. For instance, TiN, WN, or Mo can be employed. If an alloy of these metals is used for the metal film, the most suitable temperature in heat treatment for crystallization is varied depending on the composition ratio of the alloy. Therefore, if the composition ratio is adjusted suitably, the heat treatment is conducted at a temperature that does not hinder the semiconductor element manufacturing process and process options for the semiconductor element will not be reduced.

For the plastic substrate, ARTON (a product of JSR) formed of norbomen resin with polar group can be used. The plastic substrate may also be formed of polyethylene terephthalate (PET), polyether sulfone (PES), polyethylene naphthalate (PEN), polycarbonate (PC), nylon, polyether ether keton (PEEK), polysulfone (PSF), polyether imide (PEI), polyarylate (PAR), polybutylene terephthalate (PBT), polyimide, or the like.

Furthermore, in the present invention, cell layout is decided for each cell type so as to match the channel length direction of each TFT in a cell with the laser light scanning direction and to use a semiconductor film on a depressive portion of a base film as an active layer or a channel formation region, and a desired number of cells from each cell type are arranged to form cell columns along the cell column direction. The gap between cell columns is set in accordance with the laser light width. The above structure makes it possible to reduce layout complexity of a semiconductor device, in particular, an integrated circuit, while abiding by its design restrictions.

In the present invention, the formation of grain boundaries in the TFT channel formation region can be avoided with the present invention by actively using the island-like semiconductor films located on the depressive portions of the insulating film as the TFT active layers. Thus, substantial reduction in TFT mobility, reduction in ON current, and increase in OFF current due to the grain boundaries can be avoided.

Further, an ON current having a desired value can be obtained with the increase in crystallinity of the active layer, even if the size of the active layer is suppressed. The surface area of the entire driver circuit can therefore be held down. As a result, the ratio of the driver circuit to the overall semiconductor display device can be held down.

What is claimed is:

1. A method of manufacturing a semiconductor device, comprising:
    forming a base film that has a rectangular or stripe pattern concave and convex;
    forming a semiconductor film on the base film;
    irradiating the semiconductor film with laser light in the longitudinal direction of the concave and convex to enhance the crystallinity of the semiconductor film;
    etching the entire top face of the semiconductor film which is enhanced in crystallinity so as to partially expose projective portions of the concave and convex;
    patterning the etched semiconductor film to form a plurality of island-like semiconductor films only in depressive portions of the concave and convex;
    removing the plurality of the projective portion; and
    forming a plurality of cells consisting of a plurality of TFTs from the plural island-like semiconductor films,
    wherein the channel length direction of the plural TFTs matches the longitudinal direction of the concave and convex and the laser light scanning direction,
    wherein the plural cells form a plurality of columns along the channel length direction, and
    wherein a plurality of wires for electrically connecting the plural cells with one another are formed between the plural columns.

2. A method of manufacturing a semiconductor device, comprising:
    forming, on the front side of a first substrate, a metal film, a metal oxide film, a base film that has a rectangular or stripe pattern concave and convex, and a semiconductor film in this order so as to form a laminate;
    irradiating the semiconductor film with laser light in the longitudinal direction of the concave and convex to enhance the crystallinity of the semiconductor film;
    etching the entire top face of the semiconductor film which is enhanced in crystallinity so as to partially expose projective portions of the concave and convex;
    patterning the etched semiconductor film to form a plurality of island-like semiconductor films in depressive portions of the concave and convex;
    forming a plurality of TFTs from the plural island-like semiconductor films;

using a first adhesive to bond a second substrate so that the second substrate faces the first substrate across the plural TFTs;

crystallizing the metal oxide film by heat treatment;

separating the metal oxide film in into its metal film side and base film side from each other to remove the first substrate and a third substrate;

using a third adhesive to bond a plastic substrate to the base film to which a part of the metal oxide film adheres; and removing the first adhesive to remove the second substrate, wherein the plural TFTs form a plurality of cells, wherein the channel length direction of the plural TFTs matches the longitudinal direction of the concave and convex and the laser light scanning direction, wherein the plural cells form a plurality of columns along the channel length direction, and wherein a plurality of wires for electrically connecting the plural cells with one another are formed between the plural columns.

3. A method of manufacturing a semiconductor device according to claim 1, wherein the width of each of the cells in the direction perpendicular to the channel length direction is smaller than the width of the laser light in the direction perpendicular to the scanning direction.

4. A method of manufacturing a semiconductor device according to claim 2, wherein the width of each of the cells in the direction perpendicular to the channel length direction is smaller than the width of the laser light in the direction perpendicular to the scanning direction.

5. A method of manufacturing a semiconductor device according to claim 1, wherein the laser light is continuous wave laser light.

6. A method of manufacturing a semiconductor device according to claim 2, wherein the laser light is continuous wave laser light.

7. A method of manufacturing a semiconductor device, comprising:

forming a base film that has a rectangular or stripe pattern concave and convex;

forming a semiconductor film on the base film;

irradiating the semiconductor film with laser light in the longitudinal direction of the concave and convex to enhance the crystallinity of the semiconductor film;

etching the entire top face of the semiconductor film which is enhanced in crystallinity so as to partially expose projective portions of the concave and convex;

patterning the etched semiconductor film to form a plurality of island-like semiconductor films only in depressive portions of the concave and convex;

removing the plurality of the projective portion; and forming a plurality of cells consisting of a plurality of TFTs from the plural island-like semiconductor films.

8. A method of manufacturing a semiconductor device, comprising:

forming a base film that has a rectangular or stripe pattern concave and convex;

forming a semiconductor film on the base film;

irradiating the semiconductor film with laser light in the longitudinal direction of the concave and convex to enhance the crystallinity of the semiconductor film;

etching the entire top face of the semiconductor film which is enhanced in crystallinity so as to partially expose projective portions of the concave and convex;

patterning the etched semiconductor film to form a plurality of island-like semiconductor films only in depressive portions of the concave and convex;

forming a plurality of cells consisting of a plurality of TFTs from the plural island-like semiconductor films.

9. A method of manufacturing a semiconductor device according to claim 7, wherein the width of each of the cells in the direction perpendicular to the channel length direction is smaller than the width of the laser light in the direction perpendicular to the scanning direction.

10. A method of manufacturing a semiconductor device according to claim 8, wherein the width of each of the cells in the direction perpendicular to the channel length direction is smaller than the width of the laser light in the direction perpendicular to the scanning direction.

11. A method of manufacturing a semiconductor device according to claim 7, wherein the laser light is continuous wave laser light.

12. A method of manufacturing a semiconductor device according to claim 1, wherein the steps of the base film comprising:

forming a first insulating film;

forming a second insulating film over the first insulating film;

selectively etching a second insulating film to form the rectangular or stripe pattern concave and convex.

13. A method of manufacturing a semiconductor device according to claim 2, wherein the steps of the base film comprising:

forming a first insulating film;

forming a second insulating film over the first insulating film;

selectively etching a second insulating film to form the rectangular or stripe pattern concave and convex.

14. A method of manufacturing a semiconductor device according to claim 7, wherein the steps of the base film comprising:

forming a first insulating film;

forming a second insulating film over the first insulating film;

selectively etching a second insulating film to form the rectangular or stripe pattern concave and convex.

15. A method of manufacturing a semiconductor device according to claim 8, wherein the steps of the base film comprising:

forming a first insulating film;

forming a second insulating film over the first insulating film;

selectively removing a second insulating film to form the rectangular or stripe pattern concave and convex.

16. A method of manufacturing a semiconductor device according to claim 1, wherein the steps of the base film comprising:

forming a first insulating film;

selectively removing the first insulating film;

forming a second insulating film over the selectively removed first insulating film to form the rectangular or stripe pattern concave and convex.

17. A method of manufacturing a semiconductor device according to claim 2, wherein the steps of the base film comprising:

forming a first insulating film;

selectively removing the first insulating film;

forming a second insulating film over the selectively removed first insulating film to form the rectangular or stripe pattern concave and convex.

18. A method of manufacturing a semiconductor device according to claim 7, wherein the steps of the base film comprising:
forming a first insulating film;
selectively removing the first insulating film;
forming a second insulating film over the selectively removed first insulating film to form the rectangular or stripe pattern concave and convex.

19. A method of manufacturing a semiconductor device according to claim 8, wherein the steps of the base film comprising:
forming a first insulating film;
selectively removing the first insulating film;
forming a second insulating film over the selectively removed first insulating film to form the rectangular or stripe pattern concave and convex.

20. A method of manufacturing a semiconductor device according to claim 1, wherein the laser light is selected from the group consisting of an excimer laser, an Ar laser, a Kr laser, a YAG laser, a YVO4 laser, a YLF laser, a YAlO3 laser, a glass laser, a ruby laser, an alexandrite laser, and a Ti sapphire laser.

21. A method of manufacturing a semiconductor device according to claim 2, wherein the laser light is selected from the group consisting of an excimer laser, an Ar laser, a Kr laser, a YAG laser, a YVO4 laser, a YLF laser, a YAlO3 laser, a glass laser, a ruby laser, an alexandrite laser, and a Ti sapphire laser.

22. A method of manufacturing a semiconductor device according to claim 7, wherein the laser light is selected from the group consisting of an excimer laser, an Ar laser, a Kr laser, a YAG laser, a YVO4 laser, a YLF laser, a YAlO3 laser, a glass laser, a ruby laser, an alexandrite laser, and a Ti sapphire laser.

23. A method of manufacturing a semiconductor device according to claim 8, wherein the laser light is selected from the group consisting of an excimer laser, an Ar laser, a Kr laser, a YAG laser, a YVO4 laser, a YLF laser, a YAlO3 laser, a glass laser, a ruby laser, an alexandrite laser, and a Ti sapphire laser.

24. A method of manufacturing a semiconductor device according to claim 1, wherein the semiconductor device is selected from the group consisting of a display apparatus, a digital still camera, a notebook personal computer, a mobile computer, a DVD player and a cellular phone.

25. A method of manufacturing a semiconductor device according to claim 2, wherein the semiconductor device is selected from the group consisting of a display apparatus, a digital still camera, a notebook personal computer, a mobile computer, a DVD player and a cellular phone.

26. A method of manufacturing a semiconductor device according to claim 7, wherein the semiconductor device is selected from the group consisting of a display apparatus, a digital still camera, a notebook personal computer, a mobile computer, a DVD player and a cellular phone.

27. A method of manufacturing a semiconductor device according to claim 8, wherein the semiconductor device is selected from the group consisting of a display apparatus, a digital still camera, a notebook personal computer, a mobile computer, a DVD player and a cellular phone.

* * * * *